United States Patent
Terashima

(10) Patent No.: US 6,642,120 B2
(45) Date of Patent: Nov. 4, 2003

(54) SEMICONDUCTOR CIRCUIT

(75) Inventor: Tomohide Terashima, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/207,850

(22) Filed: Jul. 31, 2002

(65) Prior Publication Data

US 2003/0111694 A1 Jun. 19, 2003

(30) Foreign Application Priority Data

Dec. 13, 2001 (JP) ........................... 2001-379841
Apr. 15, 2002 (JP) ........................... 2002-112013

(51) Int. Cl.$^7$ ..................... H01L 21/331; H01L 31/112
(52) U.S. Cl. ..................... 438/309; 438/449; 438/282; 438/232; 438/154; 257/276; 257/376; 257/370; 257/379; 257/511
(58) Field of Search .................. 438/309, 449, 438/202, 155, 234, 232, 151, 154, 282; 257/276, 370, 371, 377, 379, 349, 183, 197, 616, 357, 361, 147, 107, 110, 120, 138, 329, 330, 27.015, 376, 511

(56) References Cited

U.S. PATENT DOCUMENTS

| | | | | |
|---|---|---|---|---|
| 5,013,936 A | * | 5/1991 | Shiomi et al. | 326/110 |
| 5,446,368 A | * | 8/1995 | Uscategui | 323/315 |
| 5,477,497 A | * | 12/1995 | Park et al. | 365/205 |
| 6,330,182 B1 | * | 12/2001 | Zhang | 365/154 |

FOREIGN PATENT DOCUMENTS

JP   11-289050   10/1999

OTHER PUBLICATIONS

Tomohide Terashima, et al., "60V Field NMOS and PMOS Transistors for the Multi–Voltage System Integration", Proceedings of 2001 International Symposium on Power Semiconductor Devices & ICS, Kyoto, 2001, pp. 259–262.

Kenya Kobayashi, et al., "High Voltage SOI CMOS IC Technology for Driving Plasma Display Panels", Proceedings of 1998 International Symposium on Power Semiconductor Devices & ICS, Kyoto, 1998, pp. 141–144.

* cited by examiner

Primary Examiner—Matthew Smith
Assistant Examiner—Igwe U. Anya
(74) Attorney, Agent, or Firm—Oblon, Spivak, McClelland, Maier & Neustadt, P.C.

(57) ABSTRACT

A semiconductor circuit is provided which has a high breakdown voltage and is capable of outputting a large current. Field transistors (Q1, Q11) are cross-coupled. The gate of the first field transistor (Q1) and the drain of the second field transistor (Q11) are not directly connected to the drain of an MOS transistor (Q4) but are connected to the base of a bipolar transistor (Q12). The second field transistor (Q11) has its source connected to the collector of the bipolar transistor (Q12) and the MOS transistor (Q4) has its drain connected to the emitter of the bipolar transistor (Q12). When the current amplification factor of the bipolar transistor (Q12) is taken as β, then the current of the output (SO) can be increased approximately β times.

19 Claims, 15 Drawing Sheets

F I G . 3
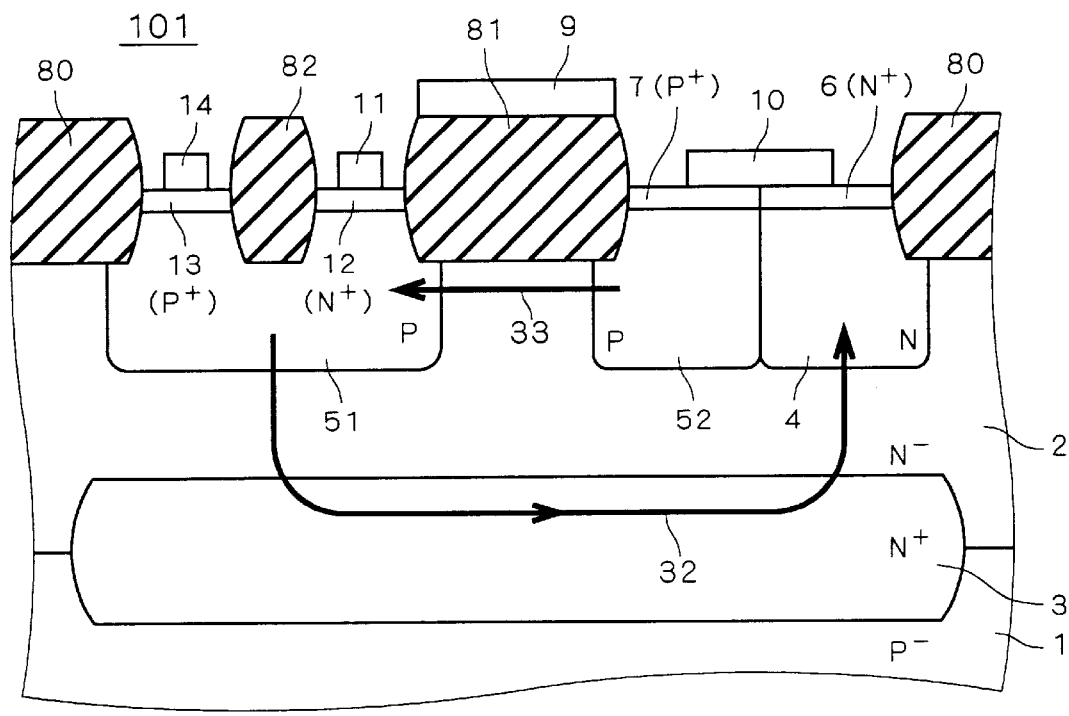

F I G . 8
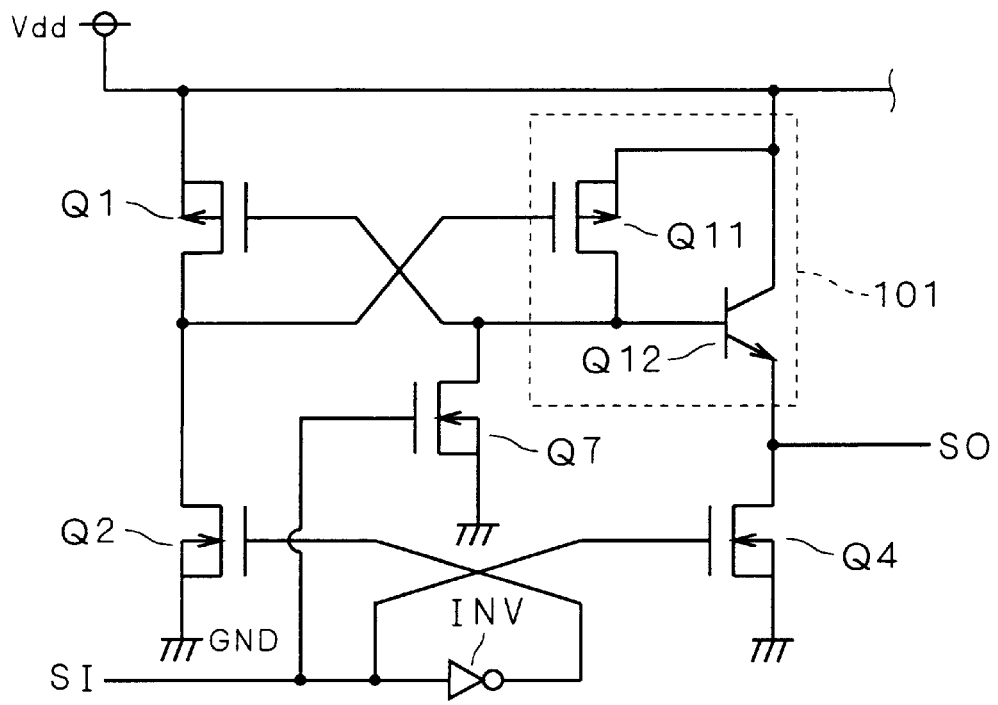
F I G . 9
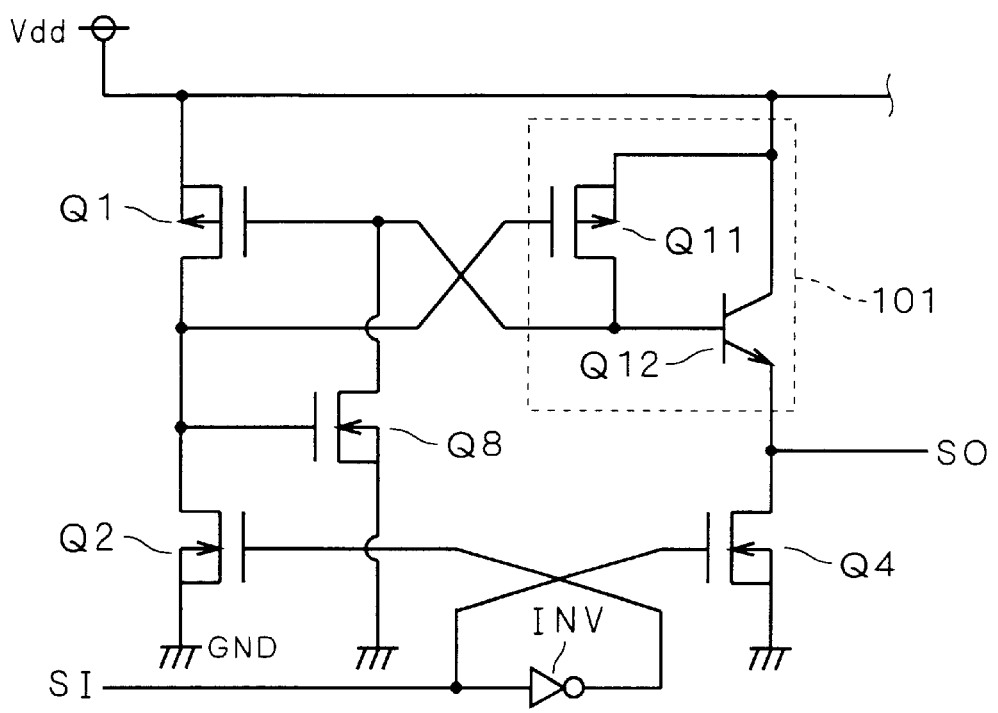

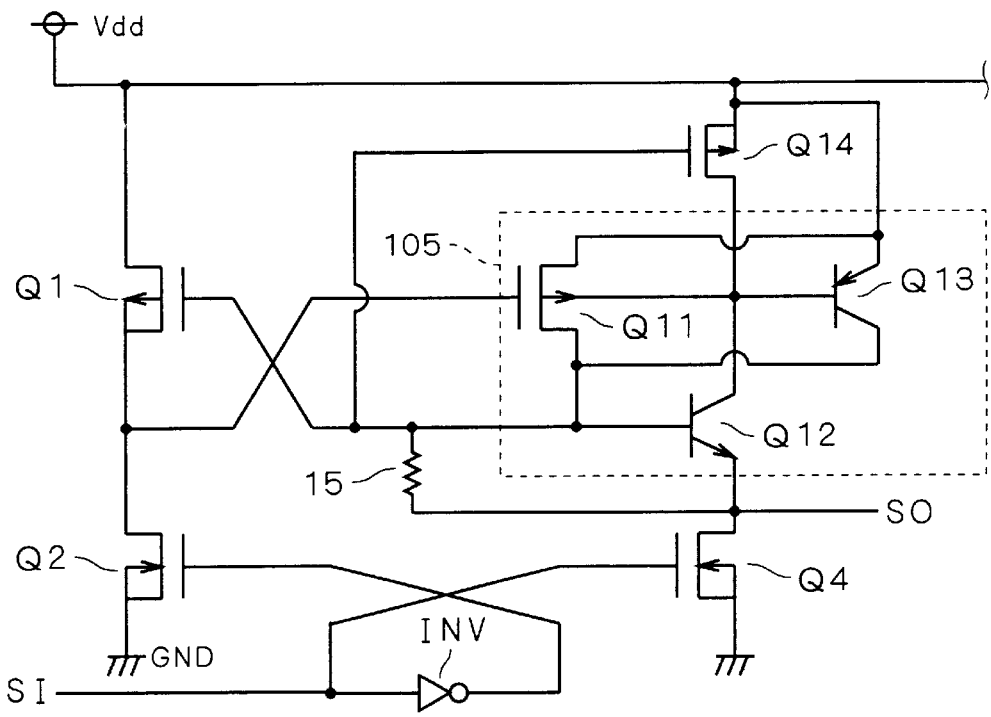
F I G . 12
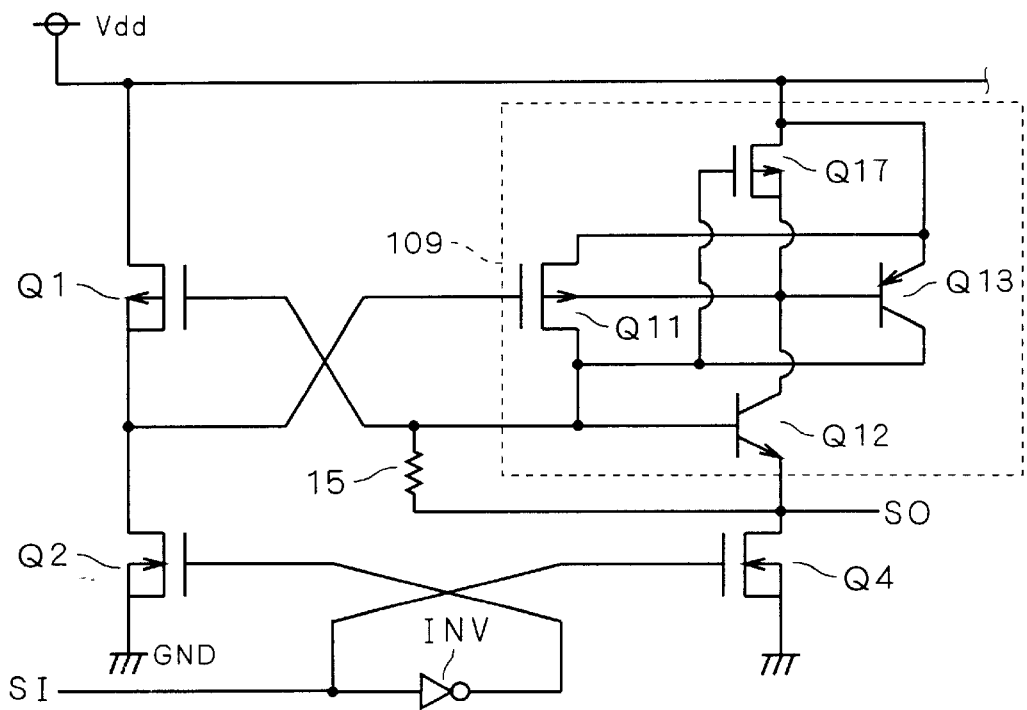
F I G . 13

<PRIOR ART>

<PRIOR ART>

200,120 B2

SEMICONDUCTOR CIRCUIT

BACKGROUND OF THE INVENTION

1. Field of the Invention

The present invention relates to a semiconductor device and a semiconductor circuit using the same, which can be applied to a configuration or a circuit which has field transistors and bipolar transistors in combination, for example.

2. Description of the Background Art

FIG. 21 is a circuit diagram showing an example of the configuration of an inverter adopted as a display driver. PMOS transistors Q1 and Q3 are cross-coupled. The transistors Q1 and Q3 have their drains connected to ground GND through NMOS transistors Q2 and Q4, respectively. A potential Vdd (>0) is given to the sources and back gates of the transistors Q1 and Q3. An input signal SI and a logically inverted version of the input signal SI, obtained through an inverter INV, are given to the gates of the transistors Q4 and Q2, respectively.

Thus, as the input signal SI takes logical "H" and "L," potentials of approximately zero and Vdd are given to the drains of the series-connected transistors Q3 and Q4, respectively. That is to say, the transistors Q1 to Q4 constitute an inverter. Furthermore, since the transistors Q1 and Q3 are cross-coupled, the potential at the drains of the transistors Q3 and Q4 is stable against the noise carried on the input signal SI.

When the potential Vdd is set at 100 V or higher in the configuration above, it is possible to realize an inverter which provides an output having a transition width of 100 V or more by using the input signal SI having a transition width of several volts. However, setting the potential Vdd so high requires that the transistors Q1 and Q3 have increased gate breakdown voltage. For this necessity, a structure with a thicker gate oxide film (a field insulating film, generally), called a field transistor, is adopted to the transistors Q1 and Q3.

FIG. 22 is a cross-sectional view showing the structure of a field transistor 200 which can be adopted as the transistors Q1 and Q3. An N⁻-type semiconductor layer 2 is formed on a P⁻-type substrate 1 and an N⁺-type semiconductor layer 3 is selectively interposed between them. Above the semiconductor layer 3 (on the side opposite to the substrate 1), field insulating films 8, P-type semiconductor layers 51 and 52, and an N-type semiconductor layer 4 are selectively formed in the main surface of the semiconductor layer 2. The semiconductor layers 51 and 52 face each other with the field insulating film 8 between them and an electrode 9 faces through the field insulating film 8 toward the main surface of the semiconductor layer 2 between the semiconductor layers 51 and 52.

P⁺-type semiconductor layers 13 and 7 and an N⁺-type semiconductor layer 6 are formed on the top surfaces of the P-type semiconductor layers 51 and 52 and the N-type semiconductor layer 4, respectively. An electrode 14 is formed on the semiconductor layer 13 and an electrode 10 is connected to the semiconductor layer 7. The electrode 10 is connected also to the semiconductor layer 6 and conductive to the semiconductor layer 2 that functions the back gate of the field transistor 200.

When a potential lower than that of the semiconductor layer 2 is applied to the electrode 9, the conductivity type of the main surface part of the semiconductor layer 2 which faces toward the electrode 9 is inverted to P type. Accordingly, as schematically shown by Arrow 33, application of a potential higher than that of the semiconductor layer 51 to the semiconductor layer 52 causes holes to move from the semiconductor layer 52 to the semiconductor layer 51 through the main surface of the semiconductor layer 2. That is, the field transistor 200 functions as a PMOS transistor. The field insulating film 8 interposed between the electrode 9 and the main surface of the semiconductor layer 2 is tens of times thicker than a common gate insulating film, so that the gate breakdown voltage can be set approximately equal to the breakdown voltage between the source and drain.

However, since the field transistor adopts the field insulating film as its gate insulating film, its effective on-state resistance, which is expressed by a product of the on-state resistance and the element area, is extremely poor. Therefore realizing a display driver which is required to provide a large current output further needs common NMOS transistors Q5 and Q6.

The potential Vdd is supplied to the drain of the transistor Q5, and the source and back gate of the transistor Q6 are connected to ground GND. The gate of the transistor Q5 is connected in common to the drains of the transistors Q3 and Q4 and the input signal SI is given to the gate of the transistor Q6. The source and back gate of the transistor Q5 and the drain of the transistor Q6 are connected in common and an output SO is given from there. However, the gate breakdown voltage of the transistor Q5 cannot be designed so high as that of the field transistor, so that a protective diode D is needed. Such technique is introduced in, for example, "60V Field NMOS and PMOS transistors for the multi-voltage system integration," Proceedings of 2001 International Symposium on Power Semiconductor Devices & ICs, pp.259–262.

SUMMARY OF THE INVENTION

The present invention has been made in consideration of the situation shown earlier, and an object of the invention is to provide a semiconductor circuit with high breakdown voltage and large current output, and a semiconductor device applicable to that semiconductor circuit.

According to a first aspect of the present invention, a semiconductor circuit includes P-type first and second field transistors, N-type first and second MOS transistors and an NPN-type first bipolar transistor. The first and second field transistors and the first and second MOS transistors each has a source, a drain and a gate. The first bipolar transistor has a collector, a base and an emitter. A potential is applied to the source of the first field transistor, the source of the second field transistor, and the collector of the first bipolar transistor. This potential is higher than both of a potential applied to the source of the first MOS transistor and a potential applied to the source of the second MOS transistor. The drain of the first field transistor and the drain of the first MOS transistor are connected to the gate of the second field transistor. The drain of the second field transistor is connected to the gate of the first field transistor and the base of the first bipolar transistor. An output signal is obtained at a connection point at which the drain of the second MOS transistor and the emitter of the first bipolar transistor are connected in common. Signals which are complementary to each other are inputted respectively to the gate of the first MOS transistor and the gate of the second MOS transistor.

A large current can be obtained as the output signal because of current amplification by the first bipolar transistor. Furthermore it is not necessary to additionally provide an NMOS transistor together with a protective diode.

Preferably, in the semiconductor circuit, the second field transistor and the first bipolar transistor constitute an insulated-gate bipolar transistor.

Carriers increase because of conductivity modulation, so that a still larger current can be obtained as the output signal.

Preferably, the semiconductor circuit further includes an N-type third MOS transistor. The third MOS transistor has a source, a drain and a gate. A signal is applied to the gate of the third MOS transistor. The signal has a same logic as the signal applied to the gate of the second MOS transistor. The source of the third MOS transistor is connected to the source of the second MOS transistor. The drain of the third MOS transistor is connected, in common, to the gate of the first field transistor, the drain of the second field transistor, and the base of the first bipolar transistor.

The third MOS transistor is on when the second field transistor is off. The voltage between the emitter and the base of the first bipolar transistor can thus be made small to suppress reduction of its breakdown voltage.

In particular, when the second field transistor and the first bipolar transistor constitute an insulated-gate bipolar transistor, the voltage at the pn junction formed by the fifth semiconductor layer and the second semiconductor layer is approximately zero, so that the turning-off operation of the insulated-gate bipolar transistor can be speeded up and the energy loss in switching can be reduced. Also, the third MOS transistor is off when the second field transistor is on, so that the connection between the emitter and the base of the first bipolar transistor is opened and the on-state resistance of the insulated-gate bipolar transistor is not adversely affected.

Preferably, the semiconductor circuit further includes an N-type third field transistor. The third field transistor has a source, a drain, and a gate. The gate of third field transistor is connected, in common, to the drain of the first MOS transistor and the drain of the first field transistor. The source of the third field transistor is connected to the source of the second MOS transistor. The drain of the third field transistor is connected, in common, to the gate of the first field transistor, the drain of the second field transistor, and the base of the first bipolar transistor.

The third field transistor is on when the second field transistor is off. Accordingly it is possible to make small the potential difference between the emitter and the base of the first bipolar transistor to reduce the reduction of its breakdown voltage.

In particular, when the second field transistor and the first bipolar transistor constitute an insulated-gate bipolar transistor, the voltage at the pn junction formed by the fifth semiconductor layer and the second semiconductor layer is approximately zero, so that the turning-off operation of the insulated-gate bipolar transistor can be speeded up and the energy loss in switching can be reduced. Also, the third MOS transistor is off when the second field transistor is on, so that the connection between the emitter and the base of the first bipolar transistor is opened and the on-state resistance of the insulated-gate bipolar transistor is not adversely affected.

According to a second aspect of the invention, a semiconductor circuit includes P-type first and second field transistors, N-type first and second MOS transistors, and first and second bipolar transistors. The first and second field transistors, and the first and second MOS transistors each has a source, a drain and a gate. The first bipolar transistor is of an NPN-type, and the second bipolar transistor is of a PNP-type. These bipolar transistors each has a collector, a base, and an emitter. A potential is applied to the source of the first field transistor and the emitter of the second bipolar transistor. The potential is higher than both of a potential applied to the source of the first MOS transistor and a potential applied to the source of the second MOS transistor. The source of the second field transistor is connected to the emitter of the second bipolar transistor or the base of the second bipolar transistor. The drain of the first field transistor and the drain of the first MOS transistor are connected to the gate of the second field transistor. The drain of the second field transistor is connected to the gate of the first field transistor, the base of the first bipolar transistor, and the collector of the second bipolar transistor. The collector of the first bipolar transistor and the base of the second bipolar transistor are connected to each other.

The first bipolar transistor and the second bipolar transistor constitute a thyristor and a large current can be outputted from the emitter of the first bipolar transistor.

Preferably, in the semiconductor circuit, the source of the second field transistor has is connected to the emitter of the second bipolar transistor. The semiconductor circuit further includes a first resistor. The first resistor is connected between the base of the second bipolar transistor and the emitter of the second bipolar transistor.

A voltage drop caused by the current flowing through the resistor when the second field transistor and the first bipolar transistor are on provides a forward bias between the base and emitter of the second bipolar transistor.

Preferably, the semiconductor circuit further includes a third field transistor. The first and second current electrodes of the third field transistor are connected between the base and the emitter of the second bipolar transistor. The gate of the third field transistor is connected to the gate of the first field transistor.

As the second field transistor is on/off, the third field transistor is off/on, so that the operation of the thyristor can be started easily.

Preferably, in the semiconductor circuit, the back gate of the third field transistor is connected to the collector of the first bipolar transistor.

The back gate of the third field transistor can be used also as the back gate of the second field transistor, the collector of the first bipolar transistor, and the base of the second bipolar transistor. Furthermore the breakdown voltage is not deteriorated.

According to a third aspect of the invention, a semiconductor circuit includes a P-type first and second field transistors, N-type first and second MOS transistors, and a PNP-type first bipolar transistor. The first and second field transistors and the first and second MOS transistors each has a source, a drain and a gate. The first bipolar transistor has a collector, a base, and an emitter. A potential is applied to the source of the first field transistor, the source of the second field transistor, and the emitter of the first bipolar transistor. The potential is higher than both of a potential applied to the source of the first MOS transistor and a potential applied to the source of the second MOS transistor. The drain of the first field transistor and the drain of the first MOS transistor are connected to the gate of the second field transistor. The drain of the second field transistor is connected to the gate of the first field transistor and the collector of the first bipolar transistor. The source of the second field transistor is connected to the base of the first bipolar transistor.

When the second MOS transistor is off and the second field transistor is on, a voltage drop due to the current flowing through the resistor turns on the first bipolar transistor. This enables an output of a large current.

Preferably, in the semiconductor circuit, a back gate of the second field transistor is connected to the base of the first bipolar transistor. The semiconductor circuit further includes a P-type third field transistor. A source, a drain and a gate of the third field transistor are connected to the emitter of the first bipolar transistor, the collector of the first bipolar transistor, and the base of the first bipolar transistor, respectively.

The third field transistor apparently increases the current amplification factor of the first bipolar transistor.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 2 and 3 are cross-sectional views showing an example of the structure of a semiconductor device of the first preferred embodiment;

FIG. 8 is a circuit diagram showing an example of the configuration of a semiconductor circuit according to a third preferred embodiment of the present invention;

FIG. 9 is a circuit diagram showing an example of the configuration of a semiconductor circuit according to a fourth preferred embodiment of the present invention;

FIG. 12 is a circuit diagram showing an example of the configuration of a semiconductor circuit according to a sixth preferred embodiment of the present invention;

FIG. 13 is a circuit diagram showing another example of the configuration of the semiconductor circuit of the sixth preferred embodiment;

DESCRIPTION OF THE PREFERRED EMBODIMENTS

First Preferred Embodiment

Figure 1:
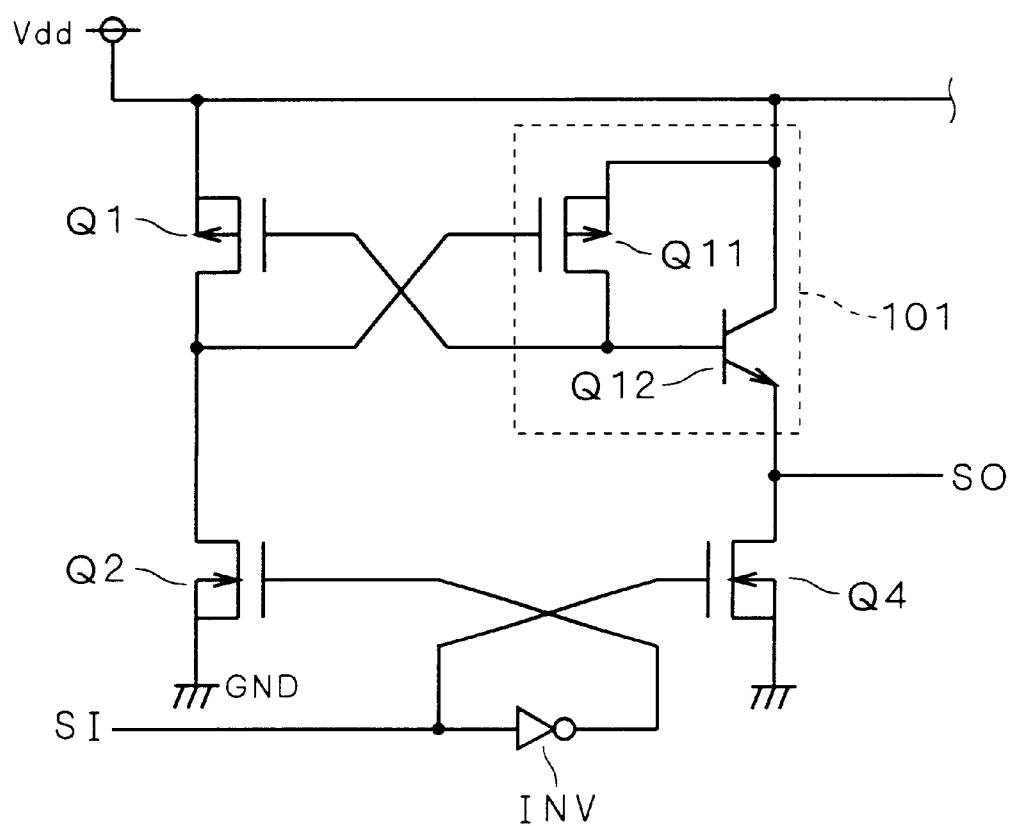
FIG. 1 is a circuit diagram showing an example of the configuration of a semiconductor circuit according to a first preferred embodiment of the present invention.

FIG. 1 is a circuit diagram showing an example of the configuration of a semiconductor circuit according to a first preferred embodiment of the present invention. This semiconductor circuit can be applied to a display driver, for example. An input signal SI is a signal which takes binary logic levels "H" and "L" with a transition width of several volts, to which the TTL level is adopted, for example. An output SO is a signal which takes binary logic levels "H" and "L" with a transition width of about Vdd, where the potential Vdd is set at around 100 to 300 V.

PMOS transistors Q1 and Q11 are field transistors and NMOS transistors Q2 and Q4 are common MOS transistors. However, note that in the present invention the term "MOS transistor" also includes those in which a field insulating film other than oxide is adopted as the gate insulating film.

The potential Vdd is applied to the sources and back gates of the transistors Q1 and Q11 and to the collector of an NPN transistor Q12. The sources of the transistors Q2 and Q4 are both connected to ground GND and supplied with a potential zero. The transistors Q1 and Q2 have their drains connected to the gate of the transistor Q11. The transistor Q11 has its drain connected to the gate of the transistor Q1 and the base of the transistor Q12. The drain and back gate of the transistor Q4 and the emitter of the transistor Q12 are connected in common; the output SO is obtained at this connection point. The input signal SI is provided to the gate of the transistor Q4 and an inverted version of the input signal SI, which is obtained through an inverter INV, is provided to the gate of the transistor Q2.

Like those described in the background art, the transistors Q1 and Q11 are cross-coupled. However, unlike those of the background art, the gate of the transistor Q1 and the drain of the transistor Q11 are not directly connected to the drain of the transistor Q4, but they are connected to the base of the transistor Q12.

Thus, when the current amplification factor of the transistor Q12 is taken as β and the current driving capabilities of the transistors Q3 and Q11 are assumed to be equal, then the inverter of the invention can provide the output SO with a current about β times that provided by the inverter formed with the transistors Q1 to Q4. This removes the necessity of separately providing the NMOS transistors Q5 and Q6 and hence the necessity of providing the protective diode D.

The transistors Q11 and Q12 can be realized together as an insulated-gate bipolar transistor (hereinafter referred to as "IGBT") 101. In this case, even if the transistor Q11 is approximately equal in size to the transistor Q3, carriers increase γ times due to the conductivity modulation. Realizing the transistors Q11 and Q12 as the IGBT 101 thus provides the output SO with still larger current. Now, the structure of a semiconductor device 100, which is similar to the IGBT 101, will be described first, and then the structure of the IGBT 101 will be described.

Figure 2:
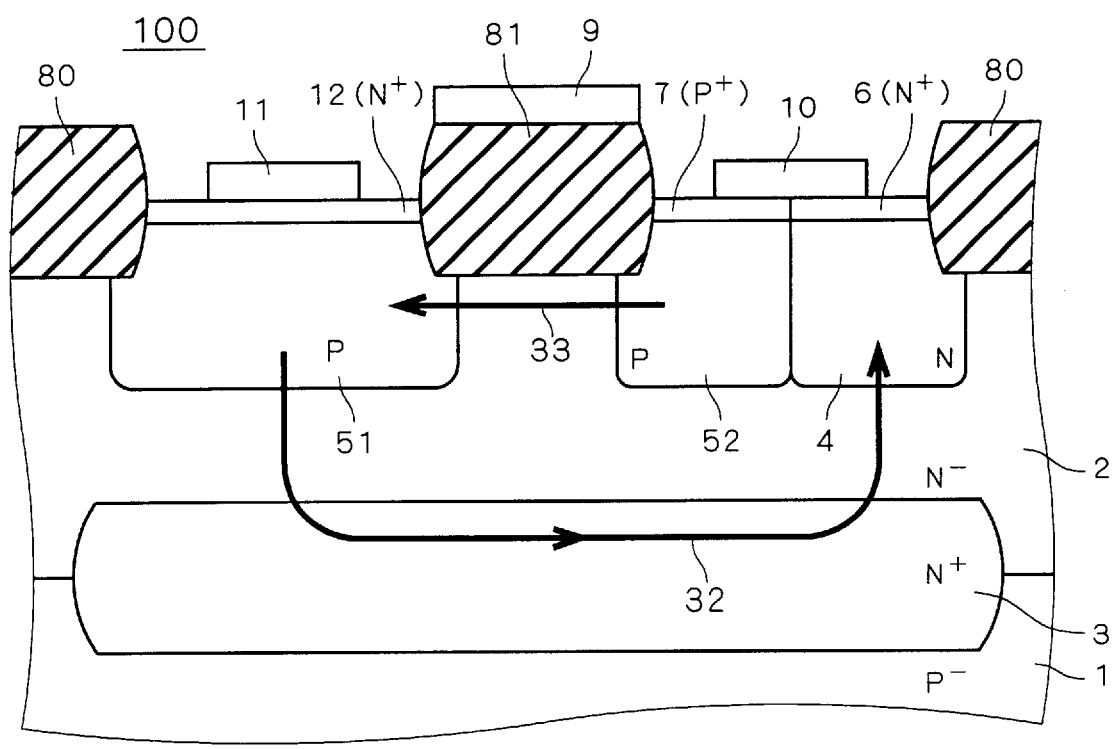

FIG. 2 is a cross-sectional view showing an example of the structure of the semiconductor device 100 according to the first preferred embodiment of the invention. A semiconductor layer 2 of N⁻ conductivity type is formed as, for example, a well, in a semiconductor substrate 1 of P⁻ conductivity type. Field insulating films 80 and 81 are selectively formed in the main surface of the semiconductor layer 2. Also, semiconductor layers 51 and 52 are selectively formed in the main surface of the semiconductor layer 2; the semiconductor layers 51 and 52 both have P type conductivity. The semiconductor layers 51 and 52 face each other with the field insulating film 81 interposed between them.

A semiconductor layer 4 of N conductivity type is also selectively formed in the main surface of the semiconductor layer 2. In the main surface of the semiconductor layer 2, the semiconductor layer 4 is formed next to the semiconductor layer 52 on the side opposite to the semiconductor layer 51. The semiconductor layers 4, 51 and 52 are interposed between the field insulating films 80 which appear as a pair in the section. However, these field insulating films 80 may be coupled to each other in an area not shown in the section to surround the semiconductor layers 4, 51 and 52 in plan view.

A semiconductor layer 12 of N⁺ conductivity type is formed on the semiconductor layer 51, a semiconductor layer 7 of P⁺ conductivity type is formed on the semiconductor layer 52, and a semiconductor layer 6 of N⁺ conductivity type is formed on the semiconductor layer 4; they are formed on the side opposite to the semiconductor layer 2.

A semiconductor layer 3 of N⁺ conductivity type faces toward the semiconductor layers 4, 51 and 52 on the side opposite to the main surface of the semiconductor layer 2. The semiconductor layer 3 is provided between the substrate 1 and the semiconductor layer 2, for example; when the semiconductor layer 2 is regarded as a well, then the semiconductor layer 3 is regarded as a buried layer in the well.

An electrode 9 faces toward the part of the semiconductor layer 2 between the semiconductor layers 51 and 52, with the field insulating film 81 interposed therebetween. An electrode 11 is formed on the semiconductor layer 12. Also, an electrode 10 is formed in contact with both the semiconductor layers 6 and 7.

When a potential lower than that of the semiconductor layer 2 is applied to the electrode 9, the conductivity type of the part of the semiconductor layer 2 which faces the electrode 9 is inverted to P type. Accordingly, applying a potential higher than that of the semiconductor layer 51 to the semiconductor layer 52 through the electrodes 10 and 11 causes holes to move, as schematically shown by Arrow 33, from the semiconductor layer 52 to the semiconductor layer 51 through the semiconductor layer 2.

Further, a potential lower than that of the semiconductor layer 2 is applied to the semiconductor layer 12 through the electrodes 10 and 11, so that electrons can be injected from the semiconductor layer 12 into the semiconductor layer 51. This movement of carriers causes conductivity modulation in the semiconductor layer 51 and, as schematically shown by Arrow 32, a large number of electrons are injected into the semiconductor layer 4 through the semiconductor layers 2 and 3. With this operation, a current flows from the electrode 10 to the electrode 11. The semiconductor device 100 thus functions as an IGBT. Since the field insulating film 81 interposed between the electrode 9 and the main surface of the semiconductor layer 2 is tens of times thicker than a common gate insulating film, the gate breakdown voltage can be set about the same as the breakdown voltage between the source and drain.

Now, the IGBT 101 can be implemented by modifying the IGBT 100. FIG. 3 is a cross-sectional view showing an example of the structure of the IGBT 101. A field insulating film 82 is formed in the semiconductor layer 51 on the side opposite to the semiconductor layers 2 and 3. Furthermore, also on the side opposite to the semiconductor layers 2 and 3, a semiconductor layer 13 of P⁺ conductivity type is formed on the semiconductor layer 51, so that the field insulating layer 82 is sandwiched between the semiconductor layer 13 and the semiconductor layer 12. An electrode 14 is connected to the semiconductor layer 13.

When it is compared with the IGBT 101 of FIG. 1, the transistor Q11 is formed with the semiconductor layer 51 as its drain, the semiconductor layer 52 as its source, the semiconductor layers 2, 3 and 4 as its back gate, and the electrode 9 as its gate. The transistor Q12 is formed with the semiconductor layer 12 as its emitter, the semiconductor layer 51 as its base, and the semiconductor layers 2, 3 and 4 as its collector.

The electrodes 9, 10, 11 and 14 function respectively as the gate electrode, the emitter electrode and the collector electrode of the IGBT 101 and as the base electrode of the transistor Q12. Hereinafter, for the sake of simplicity, the electrode 14 may be referred to as a base electrode 14 of the IGBT.

Figure 22:
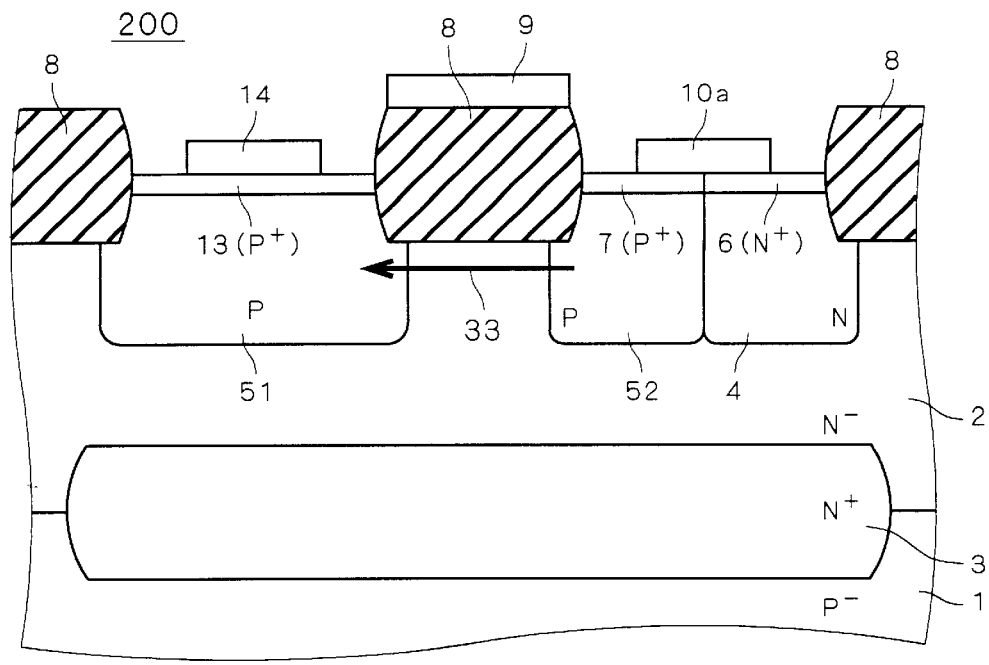
FIG. 22 is a cross-sectional view showing the structure of a conventional semiconductor device.

In the IGBT 101, part of the P⁺ semiconductor layer 13 of the field transistor 200 described referring to FIG. 22 is replaced by the semiconductor layer 12, and the field insulating film 82 is added to it. Thus extensive modification of the manufacture process is not needed and the element area is not greatly increased. The electrodes 9, 10, 11 and 14 of the IGBT 101 can be all provided on the main surface side.

The electrodes 9, 10, 11 and 14 of the IGBT 101 shown above are connected respectively to the drain of the transistor Q2, the source of the transistor Q1, the drain of the transistor Q4, and the gate of the transistor Q1, which are shown in FIG. 1, thereby constituting the semiconductor circuit of FIG. 1.

Second Preferred Embodiment

Figure 4:
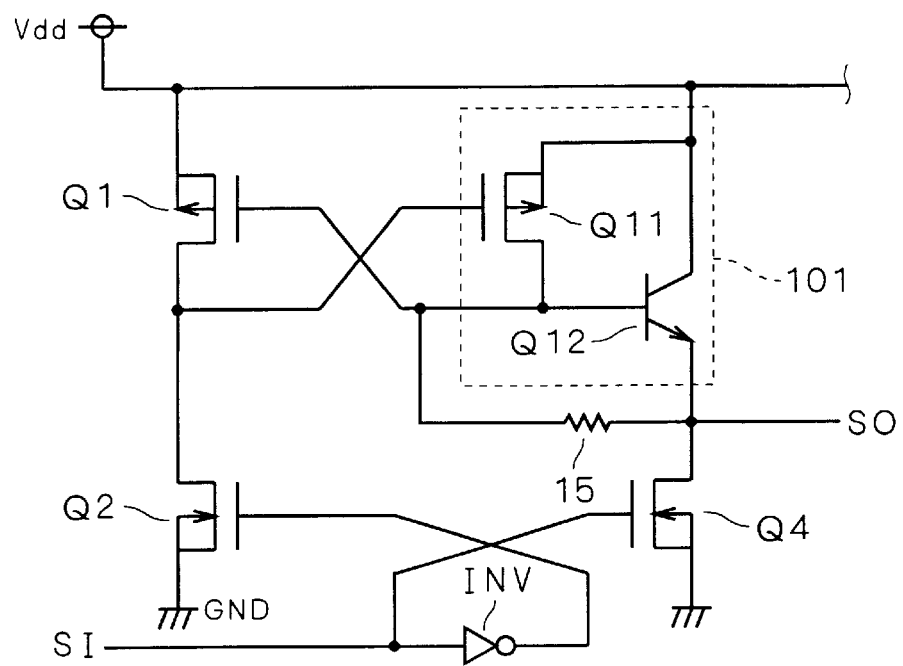
FIG. 4 is a circuit diagram showing an example of the configuration of a semiconductor circuit according to a second preferred embodiment of the present invention.

FIG. 4 is a circuit diagram showing an example of the configuration of a semiconductor circuit according to a second preferred embodiment of the invention; a resistor 15 is added to the circuit diagram shown in FIG. 1 of the first preferred embodiment. This semiconductor circuit is also applicable to a display driver, for example.

The resistor 15 has its one end connected in common to the drain of the transistor Q11 and the base of the transistor Q12 and its other end connected in common to the emitter of the transistor Q12 (i.e. the collector of the IGBT 101) and the drain of the transistor Q4.

In the semiconductor circuit, the base of the transistor Q12 is connected to the drain of the transistor Q4 through the resistor 15. This prevents the base of the transistor Q12 from coming in a floating state when the input signal SI is at the logic level "H" and the transistors Q2 and Q11 are off and the transistors Q1 and Q4 are on. This suppresses reduction of the breakdown voltage of the transistor Q12. The breakdown voltage reduction of the IGBT 101 can thus be suppressed when the transistors Q11 and Q12 are realized as the IGBT 101 together.

Also, when the transistors Q11 and Q12 are realized as the IGBT 101 together, the voltage occurring at the resistor 15 limits the forward bias voltage at the pn junction formed by the semiconductor layers 12 and 51. This produces the effects of speeding up the turn-off operation of the IGBT 101 and reducing the energy loss in switching.

The resistor 15 can be provided outside the IGBT 101 as shown in FIG. 4. Referring to FIG. 3, it can be provided between the electrodes 11 and 14. It can be realized by providing polysilicon in the substrate 1, for example. The resistor can also be implemented inside the IGBT by utilizing diffused resistors of semiconductor layers constituting the IGBT.

Figure 5:
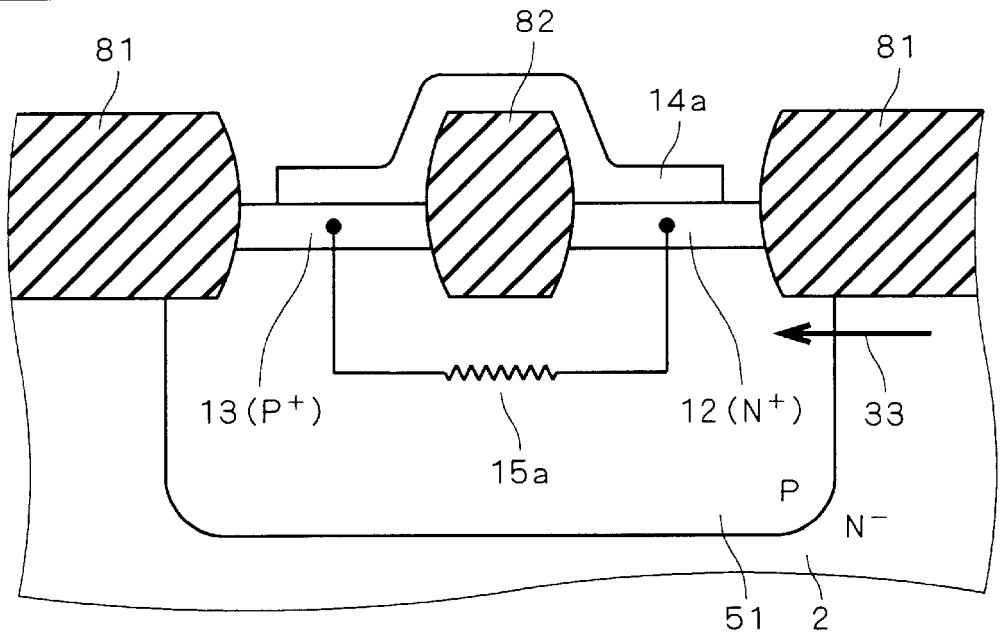
FIG. 5 is a cross-sectional view showing an example of the structure of a semiconductor device of the second preferred embodiment.

FIG. 5 is a cross-sectional view showing an example of the structure of an IGBT 102; elements not shown in this diagram are the same as those in the IGBT 101. In this IGBT 102, the electrodes 11 and 14 of the IGBT 101 are replaced by a base electrode 14a which serves as both of them and is in contact with both of the semiconductor layers 12 and 13. A diffused resistor 15a by the semiconductor layer 51 is present between the semiconductor layers 12 and 13, which functions like the resistor 15 shown in FIG. 4.

Figure 6:
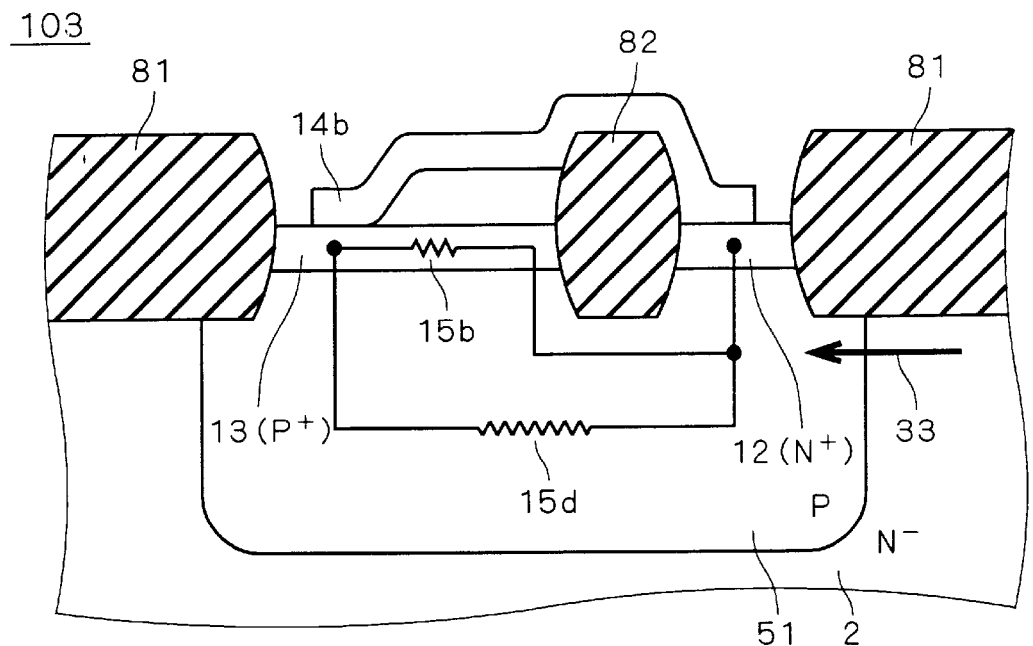
FIG. 6 is a cross-sectional view showing another example of the structure of the semiconductor device of the second preferred embodiment.

FIG. 6 is a cross-sectional view showing an example of the structure of an IGBT 103; the elements not shown in this diagram are the same as those in the IGBT 101. In the IGBT 103, the electrodes 11 and 14 of the IGBT 101 are replaced by an electrode 14b which serves as both of them and is in contact with both of the semiconductor layers 12 and 13. The electrode 14b makes contact with the semiconductor layer 13 at a distance from the field insulating film 82. Accordingly, a parallel connection of a diffused resistor 15d by the semiconductor layer 51 and a diffused resistor 15b by the semiconductor layer 13 is present between the position where the electrode 14b is in contact with the semiconductor layer 13 and the position where the electrode 14b is in contact with the semiconductor layer 12. This parallel connection functions like the resistor 15 shown in FIG. 4. Note that the diffused resistor 15b functions dominantly over the diffused resistor 15d since the semiconductor layer 13 has P+ conductivity type and the semiconductor layer 51 has P conductivity type.

Figure 7:
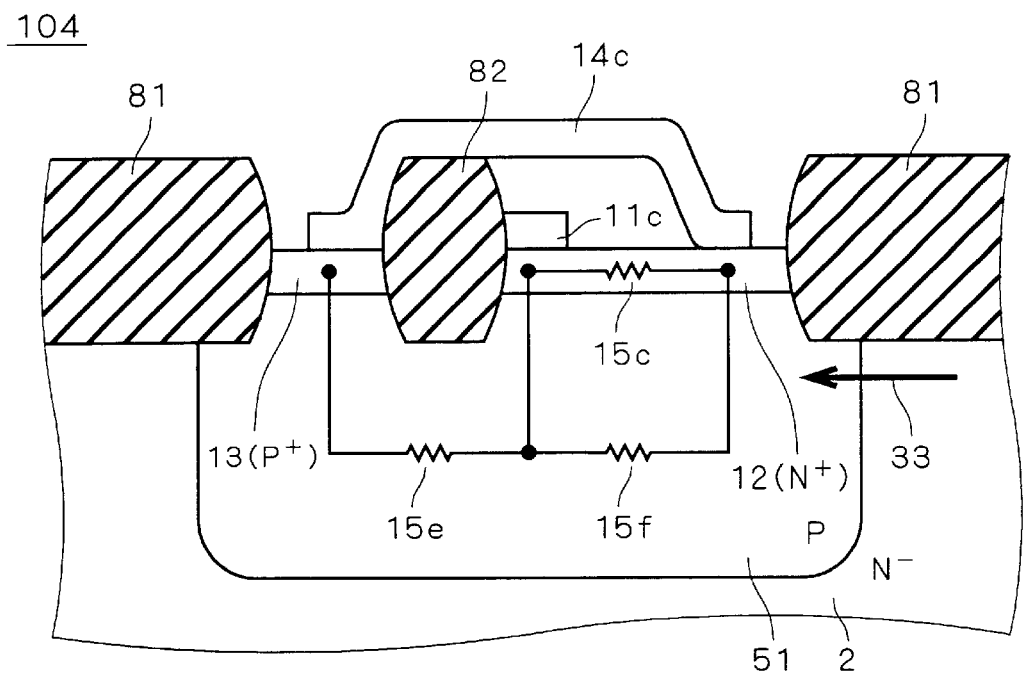
FIG. 7 is a cross-sectional view showing still another example of the structure of the semiconductor device of the second preferred embodiment.

FIG. 7 is a cross-sectional view showing an example of the structure of an IGBT 104; the elements not shown in this diagram are the same as those in the IGBT 101. In the IGBT 104, the electrodes 14 and 11 in the IGBT 101 are replaced by an electrode 14c which is in contact with both of the semiconductor layers 12 and 13 and an electrode 11c which is in contact with the semiconductor layer 12. The electrode 14c makes contact with the semiconductor layer 12 at a longer distance from the semiconductor layer 13 than the electrode 11c. Therefore a diffused resistor 15c by the semiconductor layer 12 is present between the position where the electrode 14c is in contact with the semiconductor layer 13 and the position where the electrode 14c is in contact with the semiconductor layer 12. Also, a diffused resistor 15e by the semiconductor layer 51 is present between the position where the electrode 14c is in contact with the semiconductor layer 13 and the electrode 11c, and a diffused resistor 15f by the semiconductor layer 51 is present between the position where the electrode 14c is in contact with the semiconductor layer 12 and the electrode 11c. The combined resistance of the diffused resistors 15c, 15e and 15f thus functions like the resistor 15 shown in FIG. 4. Note that the diffused resistor 15c functions dominantly over the diffused resistors 15e and 15f since the semiconductor layer 12 has N+ conductivity type and the semiconductor layer 51 has P conductivity type.

Third Preferred Embodiment

FIG. 8 is a circuit diagram showing an example of the configuration of a semiconductor circuit according to a third preferred embodiment of the invention. An NMOS transistor Q7 is added to the circuit diagram shown in FIG. 1 of the first preferred embodiment. This semiconductor circuit, too, is applicable to a display driver, for example.

The transistor Q7 has its drain connected in common to the gate of the transistor Q1, the drain of the transistor Q11, and the base of the transistor Q12, and its source and back gate connected to ground GND, like the source of the transistor Q4, and the input signal SI is given to the gate of the transistor Q7, as well as to the gate of the transistor Q4.

When the input signal SI is at the logic level "H" and the transistor Q11 is off, both of the transistors Q4 and Q7 are on and a potential of approximately zero is applied to the base and emitter of the transistor Q12. Reduction of the breakdown voltage of the transistor Q12 can thus be suppressed. Further, when the transistors Q11 and Q12 are realized with the IGBT 101 together, the voltage applied to the pn junction formed by the semiconductor layer 12 and the semiconductor layer 51 is approximately zero. This speeds up the turning-off operation of the IGBT 101 and reduces the energy loss in switching.

When the input signal SI is at the logic level "L" and the transistor Q11 is on, both of the transistors Q4 and Q7 are off. Then the connection between the emitter and the base of the transistor Q12 is opened, and so the on-state resistance of the IGBT 101 is not adversely affected. Accordingly the effective on-state resistance of the circuit shown in FIG. 8 is not deteriorated.

Fourth Preferred Embodiment

FIG. 9 is a circuit diagram showing an example of the configuration of a semiconductor circuit according to a fourth preferred embodiment of the invention, where an NMOS transistor Q8 is added to the circuit diagram shown in FIG. 1 of the first preferred embodiment. This semiconductor circuit, too, is applicable to a display driver, for example.

The transistor Q8 has its drain connected in common to the gate of the transistor Q1, the drain of the transistor Q11, and the base of the transistor Q12, its source and back gate connected to ground GND like the source of the transistor Q4, and its gate connected to the drains of the transistors Q1 and Q2 in common.

The transistor Q8 is on/off under the same conditions as the transistor Q7 shown in the third preferred embodiment, so that the same effect as that of the third preferred embodiment can be obtained. However, a field transistor is adopted as the transistor Q8 since a potential approximately equal to Vdd may be applied to the gate of the transistor Q8.

Fifth Preferred Embodiment

Figure 10:
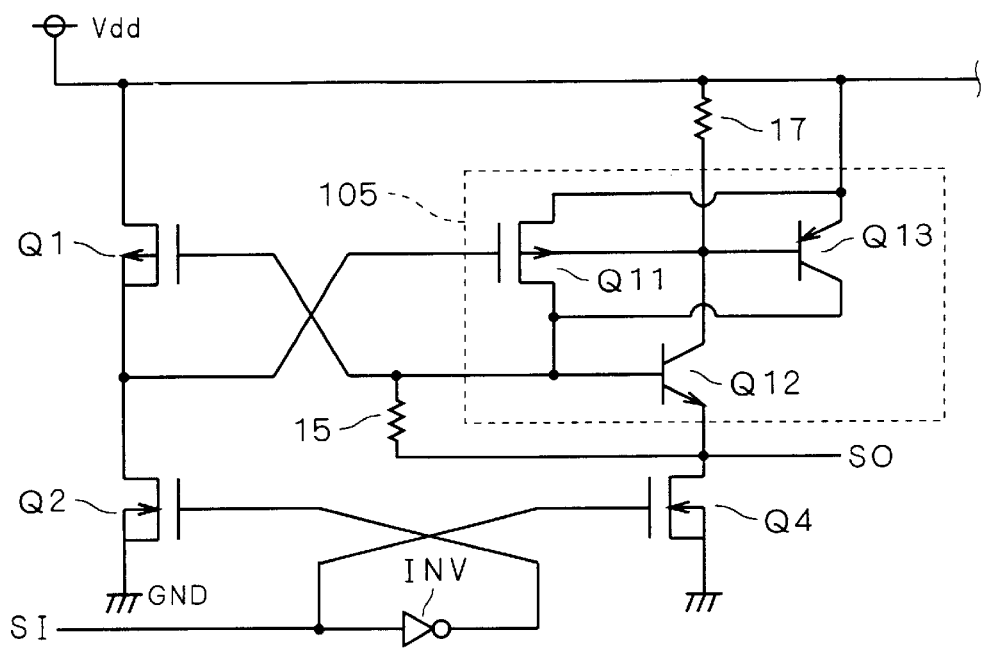
FIG. 10 is a circuit diagram showing an example of the configuration of a semiconductor circuit according to a fifth preferred embodiment of the present invention.

FIG. 10 is a circuit diagram showing an example of the configuration of a semiconductor circuit according to a fifth preferred embodiment of the invention, where a resistor 17 and a PNP transistor Q13 are added to the circuit diagram shown in FIG. 4 of the second preferred embodiment and the connection of the back gate and the source of the transistor Q11 is changed. This semiconductor circuit, too, is applicable to a display driver, for example.

The back gate and the source of the transistor Q11, which were connected to the collector of the transistor Q12 in common in the second preferred embodiment, are connected respectively to the base and the emitter of the transistor Q13 in this preferred embodiment. The potential Vdd is given to the emitter of the transistor Q13. The collector of the transistor Q13 is connected in common to the drain of the transistor Q11, the base of the transistor Q12, the gate of the transistor Q1, and one end of the resistor 15. The resistor 17 is interposed between the base and the emitter of the transistor Q13. In other respects the elements are connected in the same way as those in the second preferred embodiment.

In this preferred embodiment, when the input signal SI goes to the logic level "L," the transistors Q11 and Q12 turn on and a voltage drop due to the current flowing through the resistor 17 provides a forward bias between the base and emitter of the transistor Q13. This causes thyristor operation by the transistors Q12 and Q13. Hence a large current can be obtained as the output SO approximately according to the current characteristic of a diode to which a forward bias is applied, without being affected by the characteristic of the MOS-type transistor Q11.

The resistor 17 functions to suppress reduction of the breakdown voltage of the transistor Q13 and to reduce the switching loss, like the resistor 15 does to the transistor Q12.

Figure 11:
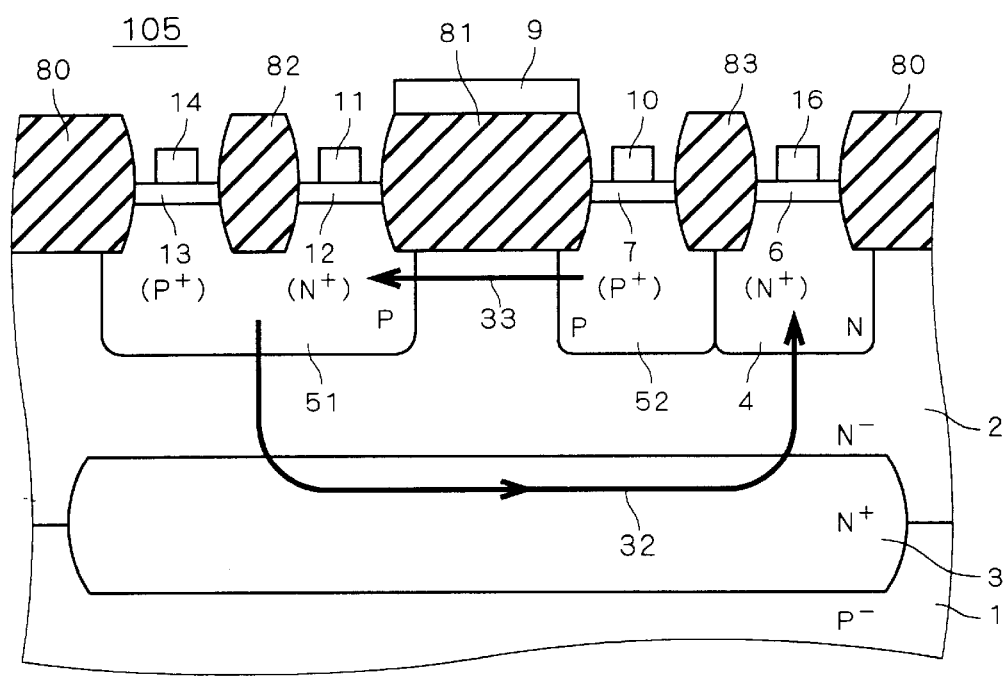
FIG. 11 is a cross-sectional view showing an example of the structure of a semiconductor device of the fifth preferred embodiment.

The transistors Q11, Q12 and Q13 can be realized together as an IGBT 105. FIG. 11 is a cross-sectional view showing an example of the structure of the IGBT 105. This structure characteristically differs from the structure of the IGBT 101 shown in FIG. 3 in that the semiconductor layers 7 and 6 are separated by a field insulating film 83 and the electrode 10 and an electrode 16 are connected respectively to them.

The transistors shown in FIG. 10 and the semiconductor layers shown in FIG. 11 correspond to each other as shown below. The transistor Q11 is formed with the semiconductor layer 51 as its drain, the semiconductor layer 52 as its source, the semiconductor layers 2, 3 and 4 as its back gate, and the electrode 9 as its gate. The transistor Q12 is formed with the semiconductor layer 12 as its emitter (the collector for the IGBT 105), the semiconductor layer 51 is its base, and the semiconductor layers 2, 3 and 4 as its collector (the emitter for the IGBT 105). The transistor Q13 is formed with the semiconductor layer 52 as its emitter (the emitter also for the IGBT 105), the semiconductor layers 2, 3 and 4 as its base, and the semiconductor layer 51 as its collector. The electrodes 9, 10, 11 and 14 function as the gate electrode, the emitter electrode, the collector electrode, and the base electrode of the IGBT 105, respectively.

While the electrode 16 is connected to the semiconductor layers 2, 3 and 4 which function as the back gate of the transistor Q11, the collector of the transistor Q12 and the base of the transistor Q13, the electrode 10 is not directly connected to the semiconductor layer 6. The resistor 15 is connected between the electrodes 11 and 14 and the resistor 17 is connected between the electrodes 10 and 16.

With the turning on of the transistor Q12, electrons flow from the semiconductor layer 12 as its emitter into the semiconductor layer 4 as its collector, and then a voltage drop at the resistor 17 provides a forward bias between the semiconductor layers 4 and 52. This causes the transistor Q13 to turn on and the thyristor operation mentioned above takes place.

Sixth Preferred Embodiment

FIG. 12 is a circuit diagram showing an example of the configuration of a semiconductor circuit according to a sixth preferred embodiment of the invention, where the resistor 17 shown in the circuit diagram of FIG. 10 of the fifth preferred embodiment is replaced by a PMOS transistor Q14. This semiconductor circuit, too, can be applied to a display driver, for example.

The transistor Q14 has its source and back gate connected in common to the emitter of the transistor Q13 and the source of the transistor Q11, and the potential Vdd is applied thereto. The drain of the transistor Q14 is connected in common to the base of the transistor Q13, the back gate of the transistor Q11, and to the collector of the transistor Q12. The gate of the transistor Q14 is connected in common to the drain of the transistor Q11, the collector of the transistor Q13, and to the base of the transistor Q12.

As the transistor Q11 turns on/off, the transistor Q14 turns off/on, which produces the advantage that the thyristor operation can be more easily started than in the fifth preferred embodiment which adopts the resistor 17.

Like the transistor Q8 shown in FIG. 9 in the fourth preferred embodiment, the transistor Q14 is constructed by adopting a field transistor. As in the fifth preferred embodiment, the IGBT 105 can be adopted also in this preferred embodiment. The resistor 15 may be replaced by the transistor Q7 or Q8 shown in the third and fourth preferred embodiments.

Since the transistor Q14 is connected between the base and emitter of the transistor Q13, a breakdown voltage around a diode built-in voltage suffices, and the breakdown voltage will not fall short even when the transistor Q14 is connected in the forward bias direction. Accordingly the source and the back gate of the transistor Q14 may both be connected to the base of the transistor Q13 and the drain of the transistor Q14 may be connected to the emitter of the transistor Q13. FIG. 13 is a circuit diagram showing the configuration of the semiconductor circuit in which the transistor Q14 of the semiconductor circuit of FIG. 12 is differently connected as shown above. In the configuration of FIG. 13, the transistor Q14 is shown as a transistor Q17 for convenience. The transistors Q11, Q12, Q13 and Q17 can be realized together as a semiconductor device 109. In the semiconductor device 109, the back gates of the transistors Q11 and Q17 can be used also as the base of the transistor Q13 and the collector of the transistor Q12.

Figure 14:
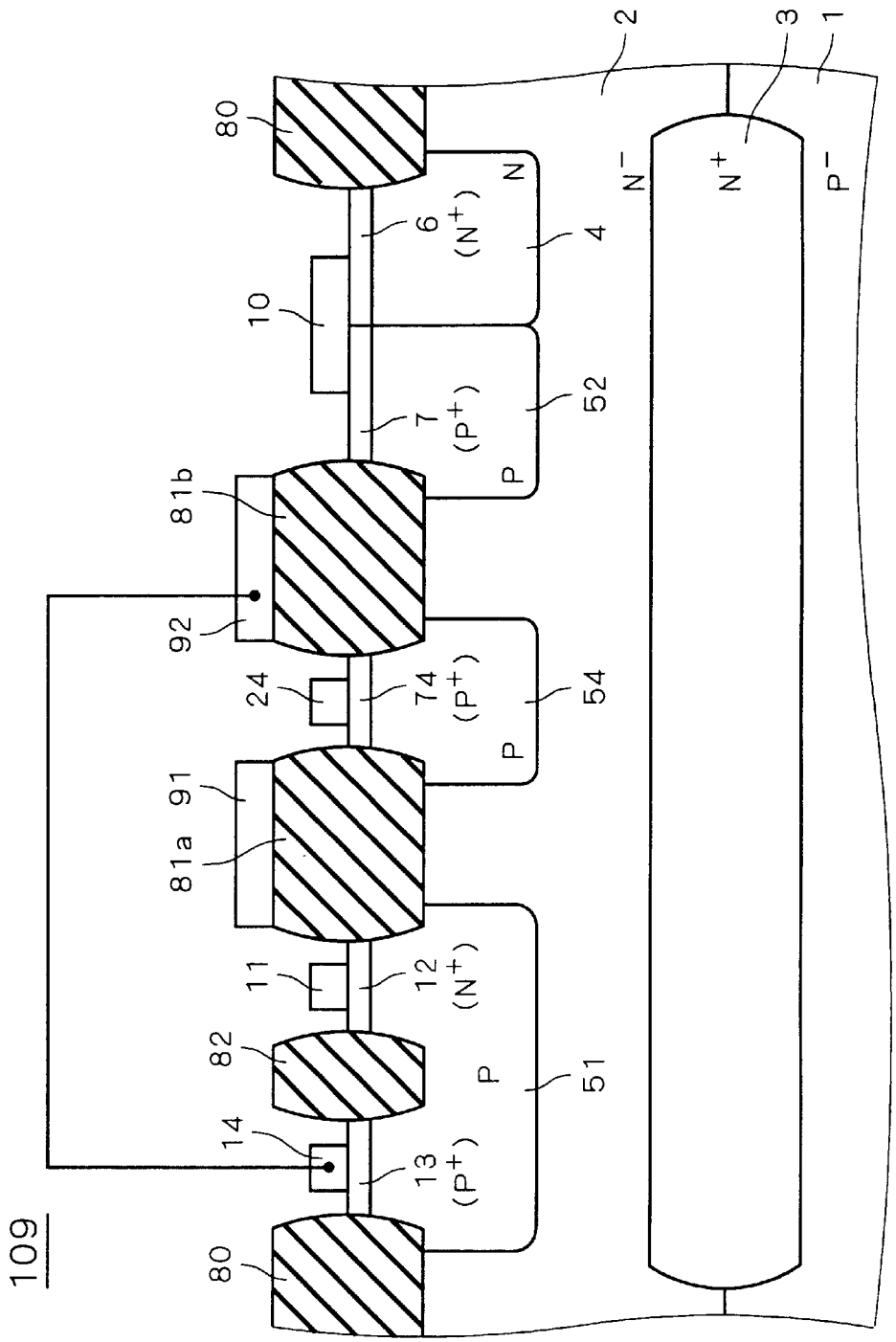
FIG. 14 is a cross-sectional view showing an example of the structure of a semiconductor device of the sixth preferred embodiment.

FIG. 14 is a cross-sectional view showing an example of the structure of the semiconductor device 109. In the portion in which the field insulating film 81 and the electrode 9 were present in the IGBT 101 shown in FIG. 3 of the first preferred embodiment, a pair of field insulating films 81a and 81b are provided at an interval and electrodes 91 and 92 are respectively provided thereon. A P-type semiconductor layer 54 is provided in the main surface of the semiconductor layer 2 in the part between the field insulating films 81a and 81b, a P+-type semiconductor layer 74 is provided on the semiconductor layer 54 on the side opposite to the semiconductor layer 2, and an electrode 24 is provided on the semiconductor layer 74. The electrode 92 is connected to the semiconductor layer 13 through the electrode 14.

The transistors shown in FIG. 13 and the semiconductor layers shown in FIG. 14 correspond to each other as shown below. The transistor Q11 is formed with the semiconductor layer 51 as its drain, the semiconductor layer 54 as its source, the semiconductor layers 2, 3 and 4 as its back gate, and the electrode 91 as its gate. The transistor Q17 is formed with the semiconductor layer 54 as its drain, the semiconductor layer 52 as its source, the semiconductor layers 2, 3 and 4 as its back gate, and the electrode 92 as its gate. The transistor Q13 is formed with the semiconductor layer 51 as its collector, the semiconductor layers 2, 3 and 4 as its base, and the semiconductor layer 54 as its emitter. The transistor Q12 is formed with the semiconductor layer 12 as its emitter, the semiconductor layer 51 as its base, and the semiconductor layers 2, 3 and 4 as its collector.

The potential Vdd is supplied to the electrode 24, the drains of the transistors Q1 and Q2 are connected to the electrode 91, the gate of the transistor Q1 is connected to the electrode 14, and the drain of the transistor Q4 is connected to the electrode 11. The resistor 15 is connected between the electrode 11 and the electrode 14. The electrode 10 serves to cause the source and back gate of the transistor Q17 to be at the same potential, which does not have to be drawn out of the semiconductor device 109.

Seventh Preferred Embodiment

Figure 15:
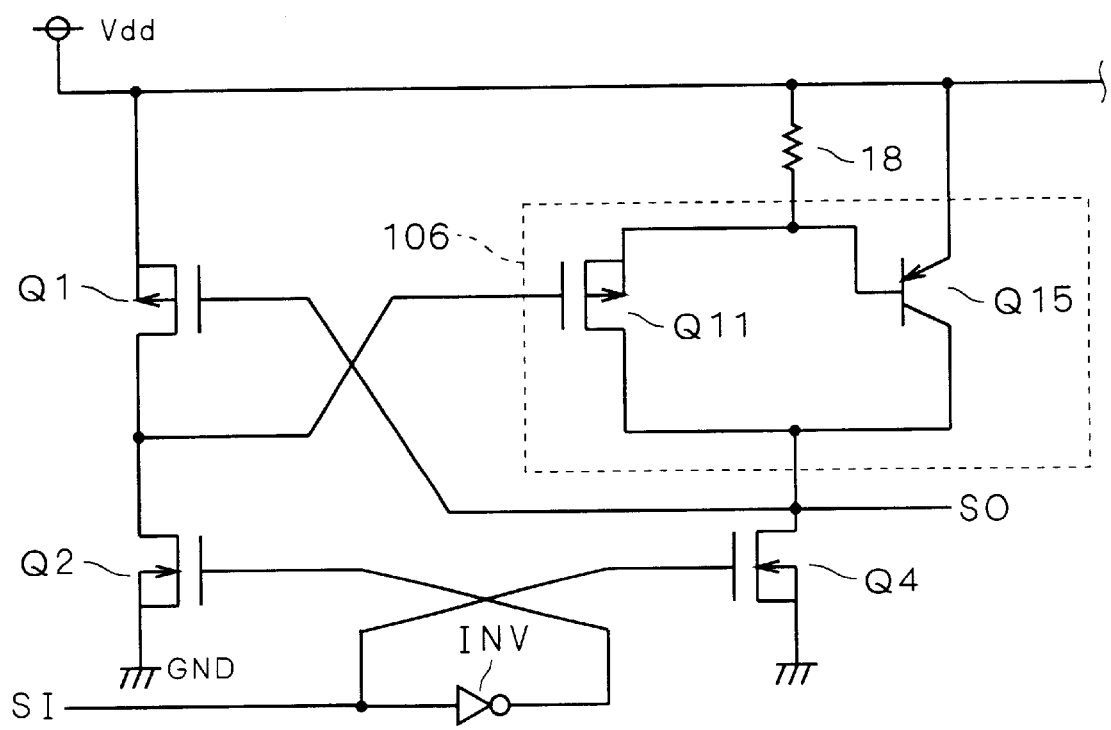
FIG. 15 is a circuit diagram showing an example of the configuration of a semiconductor circuit according to a seventh preferred embodiment of the present invention.

FIG. 15 is a circuit diagram showing an example of the configuration of a semiconductor circuit according to a seventh preferred embodiment of the invention. In this configuration, the transistor Q12 shown in the circuit diagram of FIG. 1 in the first preferred embodiment is replaced by a PNP transistor Q15 and a resistor 18 is additionally provided. This semiconductor circuit, too, can be applied to a display driver, for example.

The drain of the transistor Q11 and the collector of the transistor Q15 are connected to each other and further connected in common to the drain of the transistor Q4 and the gate of the transistor Q1. The source and back gate of the transistor Q11 are connected to the base of the transistor Q15 and also to one end of the resistor 18. The potential Vdd is applied to the other end of the resistor 18. Other components are connected as shown in the first preferred embodiment.

When the input signal SI is at the logic level "H," the transistor Q4 is on and the transistor Q11 is off. Then the output signal SO is at about ground GND or a potential zero. At this time, a small current flows to the resistor 18, where the voltage drop occurring here can be made small by setting the resistor 18 at a small value.

When the input signal SI is at the logic level "L," the transistor Q4 is off and the transistor Q11 is on. Accordingly the voltage drop due to the current flowing through the resistor 18 turns on the transistor Q15 and the potential of the output signal SO is approximately up to the potential Vdd. Then, like the transistor Q12 shown in the first preferred embodiment, the transistor Q15 can supply a large current as the output SO.

Figure 16:
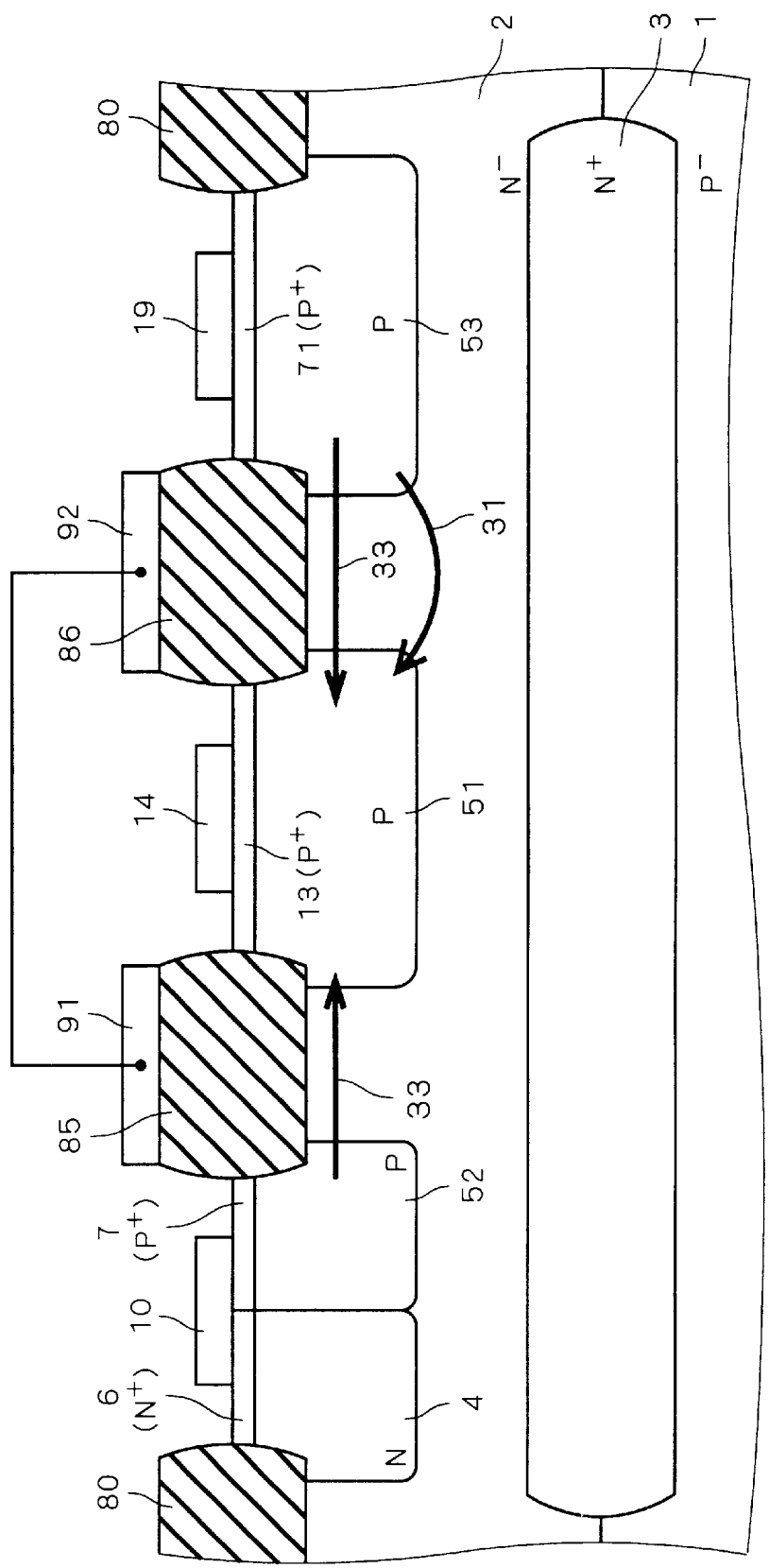
FIG. 16 is a cross-sectional view showing an example of the structure of a semiconductor device of the seventh preferred embodiment.

The transistors Q11 and Q15 can be realized together as a semiconductor device 106. FIG. 16 is a cross-sectional view showing an example of the structure of the semiconductor device 106.

A semiconductor layer 2 of N⁻ conductivity type is formed as, e.g. a well, in the substrate 1 of P⁻ conductivity type. In the main surface of the semiconductor layer 2, field insulating films 85 and 86 are selectively formed side by side between the insulating films 80 which appear as a pair in the sectional view. Semiconductor layers 51, 52 and 53, all of which are P conductivity type, and a semiconductor layer 4, which is N conductivity type, are also selectively formed in the main surface of the semiconductor layer 2. The semiconductor layers 51 and 52 face each other with the field insulating film 85 interposed between them and the semiconductor layers 51 and 53 face each other with the field insulating film 86 interposed between them. Also, in the main surface of the semiconductor layer 2, a semiconductor layer 4 is formed next to the semiconductor layer 52 on the side opposite to the semiconductor layer 51. The semiconductor layers 4 and 52 are located between the field insulating films 80 and 85 and the semiconductor layer 53 is located between the field insulating films 86 and 80.

On the side opposite to the main surface, a semiconductor layer 3 of N⁺ conductivity type is formed opposite the semiconductor layers 4, 51, 52 and 53. The semiconductor layer 3 is formed between the substrate 1 and the semiconductor layer 2, for example; when the semiconductor layer 2 is regarded as a well, it is regarded as a buried layer in the well.

On the opposite side of the semiconductor layer 2, a semiconductor layer 13 of P⁺ conductivity type is provided on the semiconductor layer 51, a semiconductor layer 7 of P⁺ conductivity type is formed on the semiconductor layer 52, a semiconductor layer 71 of P⁺ conductivity type is formed on the semiconductor layer 53, and a semiconductor layer 6 of N⁺ conductivity type is formed on the semiconductor layer 4.

An electrode 91 faces through the field insulating film 85 toward the main surface of the semiconductor layer 2 between the semiconductor layers 51 and 52, and an electrode 92 faces through the field insulating film 86 toward the main surface of the semiconductor layer 2 between the semiconductor layers 51 and 53. Electrodes 14 and 19 are formed on the semiconductor layers 13 and 71, respectively. An electrode 10 is formed in contact with both of the semiconductor layers 6 and 7.

The transistors shown in FIG. 15 and the semiconductor layers shown in FIG. 16 correspond to each other as shown below. The transistor Q11 is formed with the semiconductor layer 51 as its drain, the semiconductor layer 52 as its source, the semiconductor layers 2, 3 and 4 as its back gate and the electrode 91 as its gate. The transistor Q15 is formed with the semiconductor layer 53 as its emitter, the semiconductor layers 2, 3 and 4 as its base, and the semiconductor layer 51 as its collector. The resistor 18 is connected between the electrode 10 and the electrode 19. Arrow 31 schematically shows holes which move in the transistor Q15.

Figure 17:
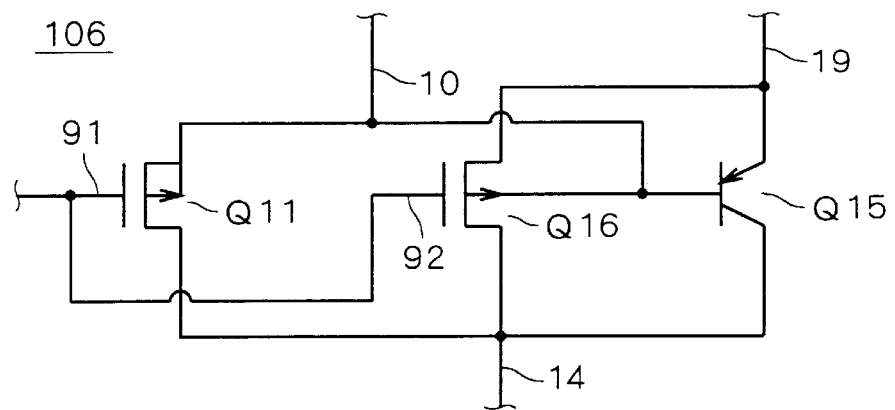
FIG. 17 is a circuit diagram showing another example of the configuration of the semiconductor circuit of the seventh preferred embodiment.

The structure shown in FIG. 16 realizes a transistor which does not appear in the circuit of FIG. 15. FIG. 17 is a circuit diagram which shows an equivalent circuit of the structure of FIG. 16 which is more precise than that of FIG. 15. A P-type field transistor Q16 is formed with the electrode 92 as its gate, the semiconductor layer 53 as its source, the semiconductor layer 51 as its drain, and the semiconductor layers 2, 3 and 4 as its back gate. Note that the electrodes 91 and 92 are connected to each other; for example, they are formed as a single structure in the semiconductor device 106. In the transistor Q16, holes move in the direction shown by Arrow 33 under the electrode 92. This direction is the same as the direction in which holes move in the transistor Q15 as shown by Arrow 31, and therefore the transistor Q16 is a desirable element which functions to apparently increase the current amplification factor $h_{FE}$ of the transistor Q15.

In the structure of the semiconductor device 106, the field insulating film 86, the electrodes 19 and 92, and the semiconductor layers 53 and 71 are added to the field transistor 200 shown in FIG. 22 as a background art. Accordingly extensive modification of the manufacture process can be avoided and the element area is not greatly enlarged. Further, the electrodes 91, 92, the electrode 10, the electrode 14, and the electrode 19 of the semiconductor device 106 can all be provided on the main surface side.

The resistor 18 can be replaced by the P-type field transistor Q14 shown in FIG. 12 of the sixth preferred embodiment. In this case, the structure is advantageous in that the thyristor operation can be more easily started than in the structure using the resistor 18.

Eighth Preferred Embodiment

Figure 18:
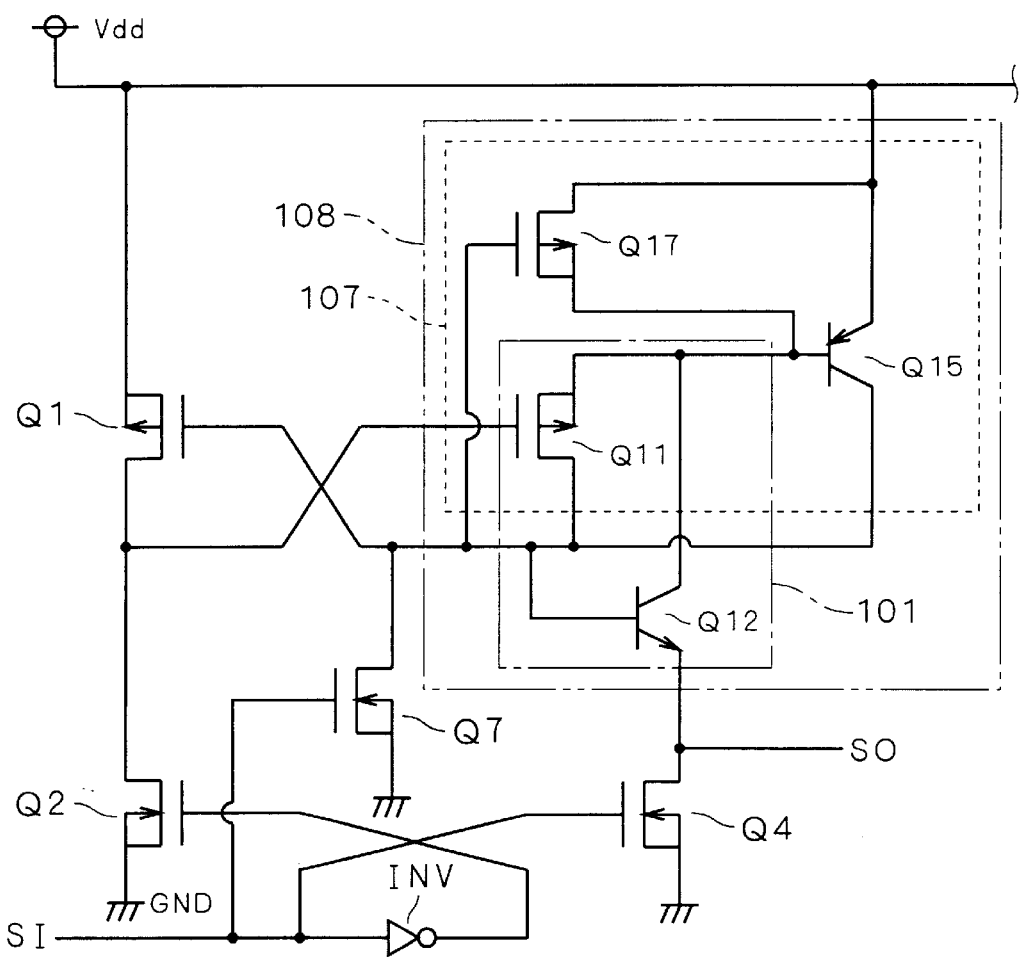
FIG. 18 is a circuit diagram showing an example of the configuration of a semiconductor circuit according to an eighth preferred embodiment of the present invention.

FIG. 18 is a circuit diagram showing an example of the configuration of a semiconductor circuit according to an eighth preferred embodiment of the invention. It can be applied to a display driver, for example. In the semiconductor circuit shown in FIG. 18, the part corresponding to the IGBT 101 in the semiconductor circuit shown in FIG. 8 of the third preferred embodiment is replaced by a semiconductor circuit 108. In the semiconductor circuit 108, the source of the transistor Q11 in the semiconductor circuit 109, which was connected to the emitter of the transistor Q13, is connected to the back gate of the transistor Q11.

The potential Vdd is applied to the source and back gate of the NMOS-type field transistor Q1, the emitter of the PNP transistor Q15, and to the drain of the PMOS-type field transistor Q17. The sources and back gates of the transistors Q2, Q4, and Q7, which are all NMOS type, are connected to ground GND and a potential zero is applied thereto. The drains of the transistors Q1 and Q2 are connected to the gate of the PMOS-type field transistor Q11. The transistor Q11 has its drain connected to the gate of the transistor Q1, the gate of the transistor Q17, the base of the NPN transistor Q12, the collector of the transistor Q15, and to the drain of the transistor Q7. The transistors Q11 and Q17 have their sources and back gates connected in common to the base of the transistor Q15 and the collector of the transistor Q12.

The drain of the transistor Q4 and the emitter of the transistor Q12 are connected in common and the output SO is obtained at the connection point. The input signal SI is applied to the gates of the transistors Q4 and Q7 and the inverted version of the input signal SI, obtained through the inverter INV, is applied to the gate of the transistor Q2.

While the transistors Q11 and Q12 form the IGBT 101, the transistors Q12 and Q15 form a thyristor. The base and emitter of the transistor Q15 are made conductive/nonconductive by the transistor Q17 and the base and emitter of the transistor Q12 are made conductive/nonconductive by the transistors Q4 and Q7. The transistor Q11 provides conduction which triggers the turning-on of the thyristor.

More specifically, when the input signal SI is at logic level "H," the transistors Q2 and Q11 are off and the transistors Q1, Q4, Q7 and Q17 are on. In this case, the thyristor is off. The base and emitter of the transistor Q15 and the base and emitter of the transistor Q12 become conductive independently. This speeds up the turning-off and reduces the switching loss.

When the input signal SI is at logic level "L," the transistors Q2 and Q11 are on and the transistors Q1, Q4, Q7 and Q17 are off. In this case the thyristor is on. The transistors Q1, Q4, Q7 and Q17 which are interposed between the base and emitter of the transistor Q15 and between the base and emitter of the transistor Q12 are all off, and therefore these transistors do not hinder the thyristor from turning on.

The transistor Q7 may be replaced by the transistor Q8 shown in FIG. 9 of the fourth preferred embodiment, or by the resistor 15 shown in FIG. 10 of the fifth preferred embodiment and FIGS. 12 and 13 in the sixth preferred embodiment.

Figure 19:
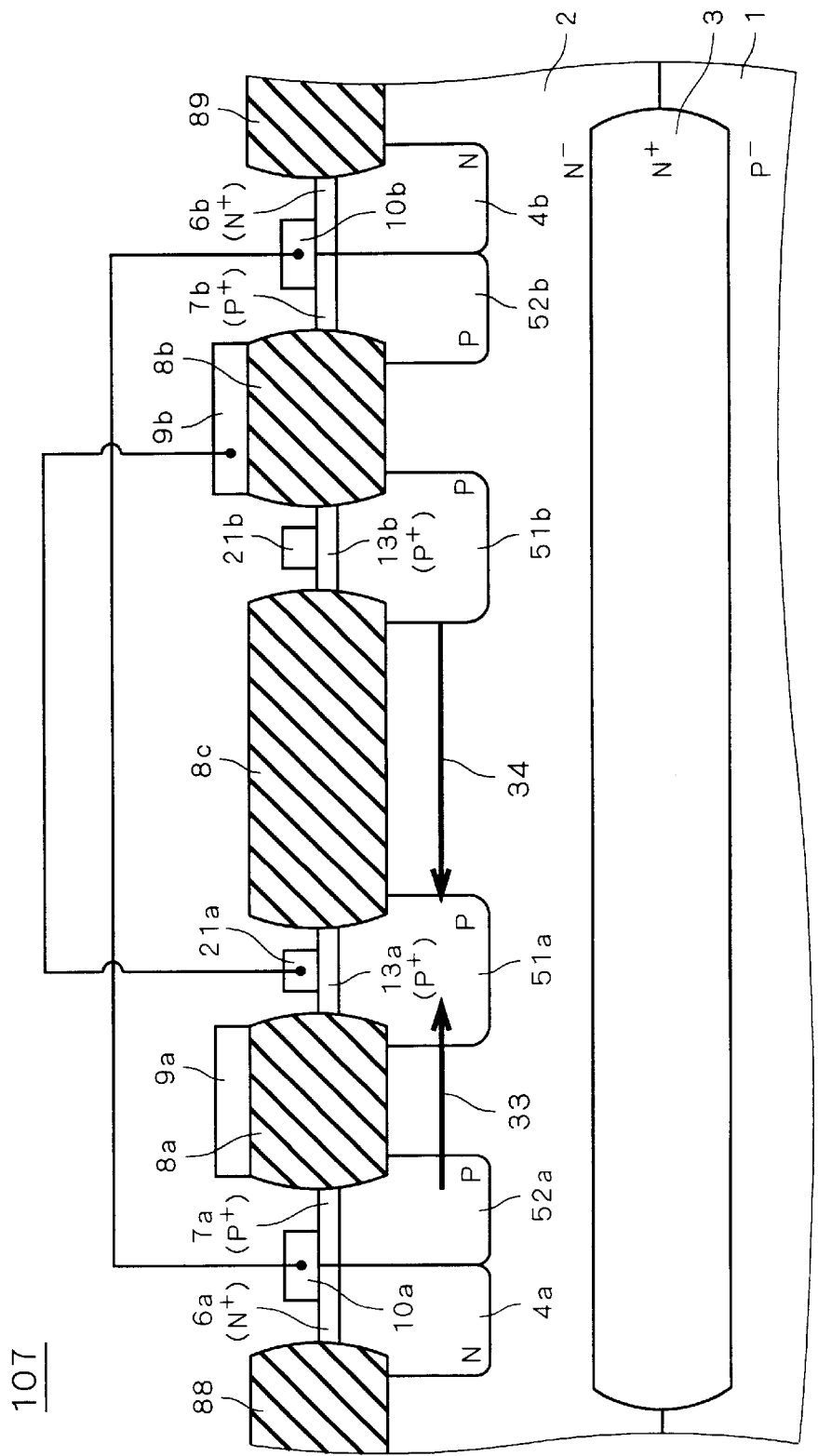
FIG. 19 is a cross-sectional view showing an example of the structure of a semiconductor device of the eighth preferred embodiment.

As explained in the first preferred embodiment, the transistors Q11 and Q12 can be formed together as the IGBT 101. In this preferred embodiment, however, the transistors Q11, Q15 and Q17 can be realized together as a semiconductor device 107. FIG. 19 is a cross-sectional view showing an example of the structure of the semiconductor device 107. In the semiconductor device 107, the semiconductor layer 2 of N⁻ conductivity type is formed as, e.g. a well, in the substrate 1 of P⁻ conductivity type. Field insulating films 88 and 89 are provided in the main surface of the semiconductor layer 2 to section an area where the transistors are formed. A piece of field insulating film 88 and a piece of field insulating film 89 are seen at the opposite ends in the section shown in FIG. 19. However, the field insulating films 88 and 89 may be coupled together in an area not shown in the section to surround in plan view the semiconductor layers 4, 51a, 51b, 52a and 52b described later.

In the main surface of the semiconductor layer 2 sectioned by the field insulating films 88 and 89, field insulating films 8a, 8c, and 8b are selectively formed side by side in this order. In the part of the main surface of the semiconductor layer 2 between the field insulating films 88 and 8a, a semiconductor layer 52a of P conductivity type is formed next to the field insulating film 8a and a semiconductor layer 4a of N conductivity type is formed next to it. In the part of the main surface of the semiconductor layer 2 between the field insulating films 89 and 8b, a semiconductor layer 52b of P conductivity type is formed next to the field insulating film 8b and a semiconductor layer 4b of N conductivity type is formed next to it. A semiconductor layer 51a of P conductivity type is formed between the field insulating films 8a and 8c in the main surface of the semiconductor layer 2. Also, a semiconductor layer 51b of P conductivity type is formed between the field insulating films 8b and 8c in the main surface of the semiconductor layer 2. Thus the semiconductor layers 51a and 52a face each other with the field insulating film 8a between them, the semiconductor layers 51b and 52b face each other with the field insulating film 8b between them, and the semiconductor layers 51a and 51b face each other with the field insulating film 8c between them.

The semiconductor layer 3 of N⁺ conductivity type is formed opposite the main surface and faces the semiconductor layers 4a, 4b, 51a, 51b, 52a and 52b. The semiconductor layer 3 is provided between the substrate 1 and the semiconductor layer 2, for example, when the semiconductor layer 2 is regarded as a well, it is regarded as a buried layer in the well.

On the side opposite to the semiconductor layers 2 and 3, a semiconductor layer 13a of P⁺ conductivity type is provided on the semiconductor layer 51a, a semiconductor layer 13b of P⁺ conductivity type is formed on the semiconductor layer 51b, a semiconductor layer 7a of P⁺ conductivity type is formed on the semiconductor layer 52a, a semiconductor layer 7b of P⁺ conductivity type is formed on the semiconductor layer 52b, a semiconductor layer 6a of N⁺ conductivity type is formed on the semiconductor layer 4a, and a semiconductor layer 6b of N⁺ conductivity type is formed on the semiconductor layer 4b.

An electrode 9a faces through the field insulating film 8a toward the semiconductor layer 2 between the semiconductor layers 51a and 52a, and an electrode 9b faces through the field insulating film 8b toward the part between the semiconductor layers 51b and 52b.

The transistor Q11 is formed with the electrode 9a as its gate, the semiconductor layers 2, 3, 4a and 4b as its back gate, the semiconductor layer 51a as its drain, and the semiconductor layer 52a as its source. The transistor Q17 is formed with the electrode 9b as its gate, the semiconductor layers 2, 3, 4a and 4b as its back gate, the semiconductor layer 51b as its drain, and the semiconductor layer 52b as its source. The transistor Q15 is formed with the semiconductor layers 2, 3, 4a and 4b as its base, the semiconductor layer 51a as its collector, and the semiconductor layer 51b as its emitter. An electrode 10a is formed in contact with both the semiconductor layers 6a and 7a, an electrode 10b is formed in contact with both the semiconductor layers 6b and 7b, an electrode 21a is formed in contact with the semiconductor layer 13a, and an electrode 21b is formed in contact with the semiconductor layer 13b. The electrodes 10a and 10b are connected to each other but do not have to be drawn out of the semiconductor device 107. The electrodes 9b and 21a are connected to each other and connected to the gate of the transistor Q1 in the circuit shown in FIG. 18. The electrode 21b is supplied with the potential Vdd in the circuit shown in FIG. 18.

Arrows 33 and 34 schematically show how holes move when the input signal SI is at logic level "L." The potential Vdd (>0) is applied to the electrode 21b and the transistors Q11 and Q17 are respectively on and off, and so holes move from the semiconductor layer 51b to the semiconductor layer 51a in the transistor Q15 as shown by Arrow 34. In the transistor Q11, as shown by Arrow 33, holes move from the semiconductor layer 52a to the semiconductor layer 51a. Such movement of holes increases the collector current of the transistor Q15. Since the transistors Q4 and Q7 are off, the thyristor formed by the transistors Q12 and Q15 turns on.

In common design, the potential Vdd is applied to the back gate of the transistor Q17. However, when the semiconductor circuit is designed so that the back gate of the transistor Q17 is connected to the base of the transistor Q15, the semiconductor layer 3 which functions as the base of the transistor Q15 can be made to function as the back gate of the transistor Q17. Then the transistors Q11, Q15 and Q17 can be formed on the semiconductor layer 3 and the size of the semiconductor device 107 can be reduced. Furthermore, since the transistor Q17 is connected between the base and emitter of the transistor Q15, a breakdown voltage around the built-in voltage of a diode suffices, and the breakdown voltage will not fall short even when the transistor Q17 is connected in the forward bias direction.

Figure 20:
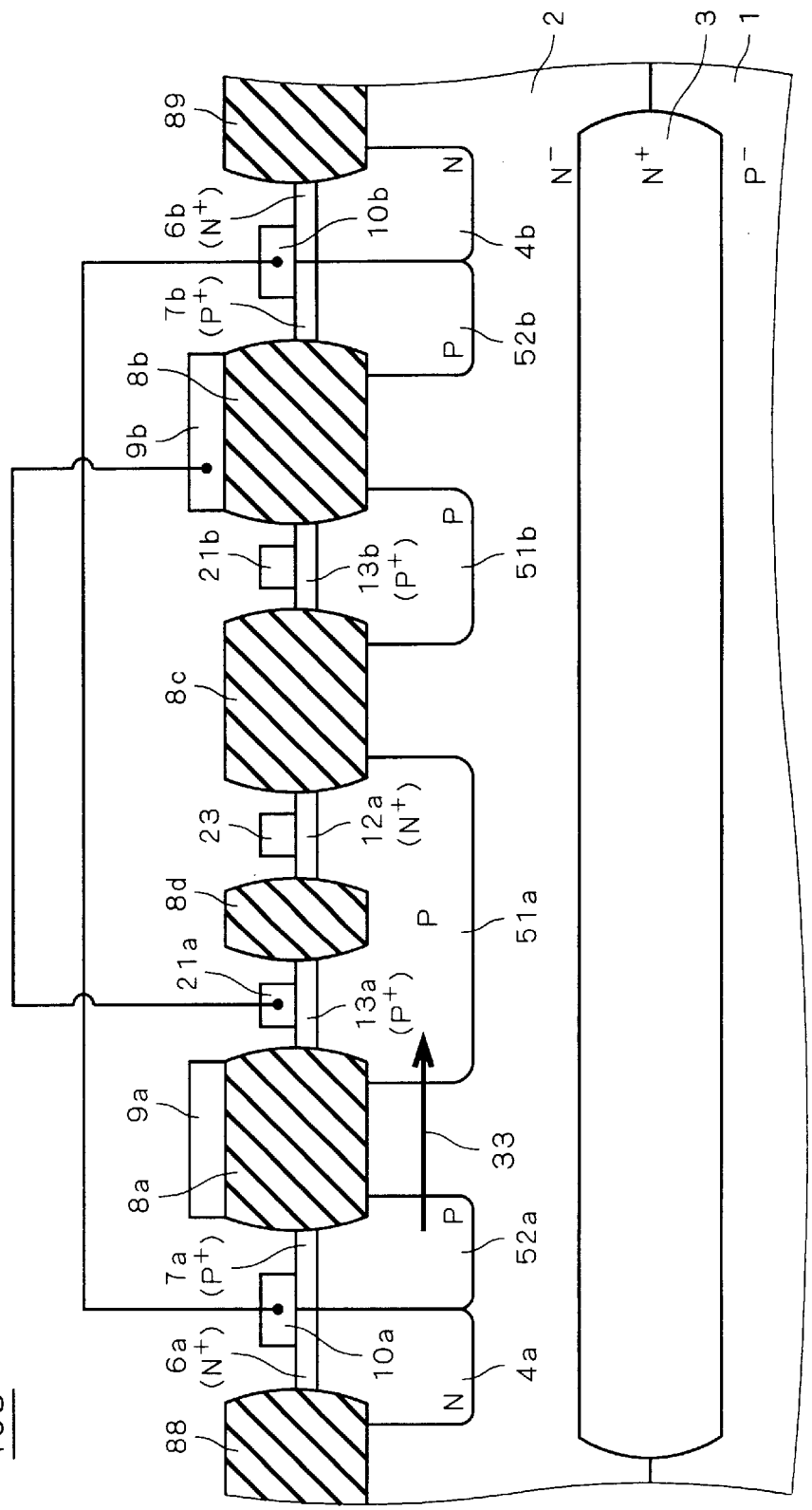
FIG. 20 is a cross-sectional view showing another example of the structure of the semiconductor device of the eighth preferred embodiment.
Figure 21:
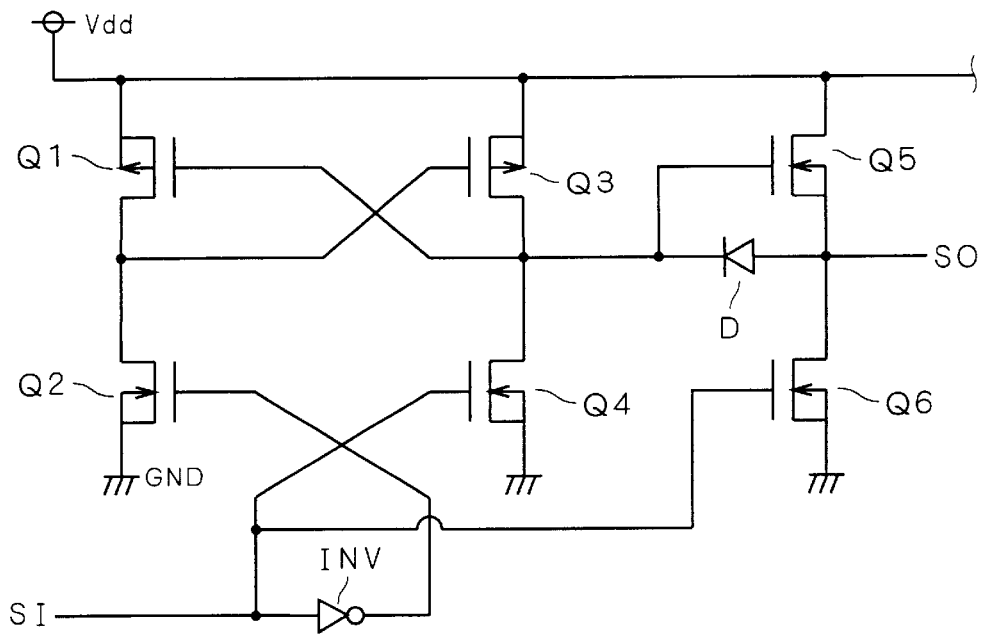
FIG. 21 is a circuit diagram showing the configuration of a conventional semiconductor circuit.

Also, the transistors Q11, Q12, Q15 and Q17 can be realized together as a semiconductor device 108. FIG. 20 is a cross-sectional view showing an example of the structure of the semiconductor device 108. The structure shown in FIG. 20 can be obtained by modifying the structure of FIG. 19 as shown below. That is to say, a field insulating film 8d is provided between the field insulating films 8a and 8c and the semiconductor layer 13a and the electrode 21a are provided only between the field insulating films 8a and 8d. Between the field insulating films 8c and 8d, an N$^+$-type semiconductor layer 12a is provided on the semiconductor layer 51a on the side opposite to the semiconductor layers 2 and 3, with an electrode 23 provided on the semiconductor layer 12a.

The semiconductor layer 12a, the semiconductor layer 51a, and the semiconductor layers 2, 3, 4a and 4b function as the emitter, base, and collector of the transistor Q12, respectively. The electrode 23 is therefore connected to the drain of the transistor Q4 in FIG. 18.

The semiconductor layers 2, 3, 4a and 4b function not only as the back gates of the transistors Q11 and Q17 and the base of the transistor Q15 but also as the collector of the transistor Q12, so that the semiconductor device 108 can be obtained in a small area in plan view.

While the invention has been described in detail, the foregoing description is in all aspects illustrative and not restrictive. It is understood that numerous other modifications and variations can be devised without departing from the scope of the invention.

What is claimed is:

1. A semiconductor circuit, comprising:
   a P-type first field transistor having a source, a drain, and a gate;
   a P-type second field transistor having a source, a drain, and a gate;
   an N-type first MOS transistor having a source, a drain, and a gate;
   an N-type second MOS transistor having a source, a drain, and a gate; and
   an NPN-type first bipolar transistor having a collector, a base, and an emitter, wherein
   a potential which is higher than both of a potential applied to said source of said first MOS transistor and a potential applied to said source of said second MOS transistor is applied to said source of said first field transistor, said source of said second field transistor, and said collector of said first bipolar transistor,
   said drain of said first field transistor and said drain of said first MOS transistor are connected to said gate of said second field transistor,
   said drain of said second field transistor is connected to said gate of said first field transistor and said base of said first bipolar transistor,
   an output signal is obtained at a connection point at which said drain of said second MOS transistor and said emitter of said first bipolar transistor are connected in common, and
   signals which are complementary to each other are inputted respectively to said gate of said first MOS transistor and said gate of said second MOS transistor.

2. The semiconductor circuit according to claim 1, wherein said second field transistor and said first bipolar transistor constitute an insulated-gate bipolar transistor.

3. The semiconductor circuit according to claim 2, wherein said insulated-gate bipolar transistor comprises:
   a first semiconductor layer having a first conductivity type and having a main surface;
   a first field insulating film selectively provided in said main surface;
   a second semiconductor layer and a third semiconductor layer both having a second conductivity type opposite to said first conductivity type, said second semiconductor layer and said third semiconductor layer being selectively provided in said main surface and facing each other with said first field insulating film therebetween;
   a fourth semiconductor layer having said first conductivity type and selectively provided in said main surface on a side of said third semiconductor layer which is opposite to the side where said second semiconductor layer is provided;
   a fifth semiconductor layer having said first conductivity type and selectively provided on a side of said second semiconductor layer which is opposite to said first semiconductor layer;
   a sixth semiconductor layer having said first conductivity type and facing all of said second to fourth semiconductor layers on a side opposite to said main surface;
   a second field insulating film provided in said second semiconductor layer on a side opposite to said sixth semiconductor layer;

a seventh semiconductor layer having said second conductivity type and having a higher impurity concentration than said second semiconductor layer, said seventh semiconductor layer being provided on said second semiconductor layer on the side opposite to said sixth semiconductor layer and located so that said second field insulating film is interposed between said seventh semiconductor layer and said fifth semiconductor layer;

a first electrode facing through said first field insulating film to said first semiconductor layer between said second semiconductor layer and said third semiconductor layer; and a second electrode electrically connected to both of said third semiconductor layer and said fourth semiconductor layer.

4. The semiconductor circuit according to claim 3, further comprising a third electrode in contact with said fifth semiconductor layer and said seventh semiconductor layer.

5. The semiconductor circuit according to claim 4, further comprising a fourth electrode in contact with said fifth semiconductor layer, wherein said third electrode is in contact with said fifth semiconductor layer at a longer distance from said seventh semiconductor layer than said fourth electrode.

6. The semiconductor circuit according to claim 1, further comprising a first resistor connected between said base and said emitter of said first bipolar transistor.

7. The semiconductor circuit according to claim 1, further comprising an N-type third MOS transistor having a source, a drain and a gate, wherein a signal having a same logic as the signal applied to said gate of said second MOS transistor is applied to said gate of said third MOS transistor, said source of said third MOS transistor is connected to said source of said second MOS transistor, and said drain of said third MOS transistor is connected, in common, to said gate of said first field transistor, said drain of said second field transistor, and said base of said first bipolar transistor.

8. The semiconductor circuit according to claim 1, further comprising an N-type third field transistor having a source, a drain, and a gate, wherein said gate of said third field transistor is connected, in common, to said drain of said first MOS transistor and said drain of said first field transistor, said source of said third field transistor is connected to said source of said second MOS transistor, and said drain of said third field transistor is connected, in common, to said gate of said first field transistor, said drain of said second field transistor, and said base of said first bipolar transistor.

9. A semiconductor circuit, comprising:

a P-type first field transistor having a source, a drain, and a gate;

a P-type second field transistor having a source, a drain, and a gate;

an N-type first MOS transistor having a source, a drain, and a gate;

an N-type second MOS transistor having a source, a drain, and a gate;

an NPN-type first bipolar transistor having a collector, a base, and an emitter; and a PNP-type second bipolar transistor having a collector, a base, and an emitter, wherein a potential which is higher than both of a potential applied to said source of said first MOS transistor and a potential applied to said source of said second MOS transistor is applied to said source of said first field transistor and said emitter of said second bipolar transistor, said source of said second field transistor is connected to said emitter of said second bipolar transistor or said base of said second bipolar transistor, said drain of said first field transistor and said drain of said first MOS transistor is connected to said gate of said second field transistor, said drain of said second field transistor is connected to said gate of said first field transistor, said base of said first bipolar transistor, and said collector of said second bipolar transistor, and said collector of said first bipolar transistor and said base of said second bipolar transistor are connected to each other.

10. The semiconductor circuit according to claim 9, wherein said source of said second field transistor is connected to said emitter of said second bipolar transistor, and said semiconductor circuit further comprises a first resistor connected between said base of said second bipolar transistor and said emitter of said second bipolar transistor.

11. The semiconductor circuit according to claim 9, further comprising a third field transistor having first and second current electrodes connected between said base and said emitter of said second bipolar transistor and a gate connected to said gate of said first field transistor.

12. The semiconductor circuit according to claim 11, wherein said third field transistor further has a back gate connected to said collector of said first bipolar transistor.

13. The semiconductor circuit according to claim 12, wherein said source of said second field transistor is connected to said emitter of said second bipolar transistor.

14. The semiconductor circuit according to claim 13, wherein an integrated structure including said second field transistor, said third field transistor, said first bipolar transistor, and said second bipolar transistor comprises:

a first semiconductor layer having a first conductivity type and having a main surface;

a pair of first field insulating films selectively provided in said main surface;

a second semiconductor layer and a third semiconductor layer both having a second conductivity type opposite to said first conductivity type, said second semiconductor layer and said third semiconductor layer being selectively provided in said main surface and facing each other with both of said pair of first field insulating films therebetween;

a fourth semiconductor layer having said first conductivity type and selectively provided in said main surface on a side of said third semiconductor layer which is opposite to the side where said second semiconductor layer is provided;

a fifth semiconductor layer having said first conductivity type and selectively provided on a side of said second semiconductor layer which is opposite to said first semiconductor layer;

a sixth semiconductor layer having said first conductivity type and facing all of said second to fourth semiconductor layers on a side opposite to said main surface;

a second field insulating film provided in said second semiconductor layer on a side opposite to said sixth semiconductor layer;

a seventh semiconductor layer having said second conductivity type and having a higher impurity concentration than said second semiconductor layer, said seventh semiconductor layer being provided on said second semiconductor layer on the side opposite to said sixth semiconductor layer and located so that said second field insulating film is interposed between said seventh semiconductor layer and said fifth semiconductor layer;

an eighth semiconductor layer having said second conductivity type and selectively provided in said main surface, said eighth semiconductor layer facing said second semiconductor layer with one of said pair of first field insulating films therebetween and facing said third semiconductor layer with the other of said pair of first field insulating films therebetween;

a first electrode facing through said one of said pair of first field insulating films to said first semiconductor layer between said second semiconductor layer and said eighth semiconductor layer;

a second electrode facing through said other of said pair of first field insulating films to said first semiconductor layer between said third semiconductor layer and said eighth semiconductor layer, said second electrode being electrically connected to said seventh semiconductor layer; and a third electrode electrically connected to both of said third semiconductor layer and said fourth semiconductor layer.

15. The semiconductor circuit according to claim 12, wherein said source of said second field transistor is connected to said base of said second bipolar transistor.

16. The semiconductor circuit according to claim 9, wherein an integrated structure including said second field transistor, said first bipolar transistor, and said second bipolar transistor comprises:
a first semiconductor layer having a first conductivity type and having a main surface;
a first field insulating film selectively provided in said main surface;
a second semiconductor layer and a third semiconductor layer both having a second conductivity type opposite to said first conductivity type, said second semiconductor layer and said third semiconductor layer being selectively provided in said main surface and facing each other with said first field insulating film therebetween;
a fourth semiconductor layer having said first conductivity type and selectively provided in said main surface on a side of said third semiconductor layer which is opposite to the side where said second semiconductor layer is provided;
a fifth semiconductor layer having said first conductivity type and selectively provided on a side of said second semiconductor layer which is opposite to said first semiconductor layer;
a sixth semiconductor layer having said first conductivity type and facing all of said second to fourth semiconductor layers on a side opposite to said main surface;
a first electrode facing through said first field insulating film to said first semiconductor layer between said second semiconductor layer and said third semiconductor layer;
a second field insulating film provided in said second semiconductor layer on a side opposite to said sixth semiconductor layer;

a seventh semiconductor layer having said second conductivity type and having a higher impurity concentration than said second semiconductor layer, said seventh semiconductor layer being provided on said second semiconductor layer on the side opposite to said sixth semiconductor layer and located so that said second field insulating film is interposed between said seventh semiconductor layer and said fifth semiconductor layer;

an eighth semiconductor layer having said second conductivity type and having a higher impurity concentration than said third semiconductor layer, said eighth semiconductor layer being provided on said third semiconductor layer on the side opposite to said sixth semiconductor layer;

a ninth semiconductor layer having said first conductivity type and having a higher impurity concentration than said fourth semiconductor layer, said ninth semiconductor layer being provided on said fourth semiconductor layer on the side opposite to said sixth semiconductor layer; and a third field insulating film separating said eighth semiconductor layer and said ninth semiconductor layer.

17. A semiconductor circuit, comprising:
a P-type first field transistor having a source, a drain, and a gate;
a P-type second field transistor having a source, a drain, and a gate;
an N-type first MOS transistor having a source, a drain, and a gate;
an N-type second MOS transistor having a source, a drain, and a gate; and
a PNP-type first bipolar transistor having a collector, a base, and an emitter; wherein
a potential which is higher than both of a potential applied to said source of said first MOS transistor and a potential applied to said source of said second MOS transistor is applied to said source of said first field transistor, said source of said second field transistor, and said emitter of said first bipolar transistor,
said drain of said first field transistor and said drain of said first MOS transistor are connected to said gate of said second field transistor,
said drain of said second field transistor is connected to said gate of said first field transistor and said collector of said first bipolar transistor, and
said source of said second field transistor is connected to said base of said first bipolar transistor.

18. The semiconductor circuit according to claim 17, wherein
said second field transistor further has a back gate connected to said base of said first bipolar transistor, and
said semiconductor circuit further comprises a P-type third field transistor having a source connected to said emitter of said first bipolar transistor, a drain connected to said collector of said first bipolar transistor, and a back gate connected to said base of said first bipolar transistor.

19. The semiconductor circuit according to claim 18, wherein an integrated structure including said first bipolar transistor, said second field transistor, and said third field transistor comprises:
a first semiconductor layer having a first conductivity type and having a main surface;

first and second field insulating films selectively provided in said main surface;

a second semiconductor layer and a third semiconductor layer both having a second conductivity type opposite to said first conductivity type, said second semiconductor layer and said third semiconductor layer being selectively provided in said main surface and facing each other with said first field insulating film therebetween;

a fourth semiconductor layer having said first conductivity type and selectively provided in said main surface on a side of said third semiconductor layer which is opposite to the side where said second semiconductor layer is provided;

a fifth semiconductor layer having said second conductivity type and selectively provided in said main surface, said fifth semiconductor layer facing said second semiconductor layer with said second field insulating film therebetween;

a sixth semiconductor layer having said first conductivity type and facing all of said second to fourth semiconductor layers on a side opposite to said main surface;

a first electrode facing through said first field insulating film to said first semiconductor layer between said second semiconductor layer and said third semiconductor layer;

a second electrode facing through said second field insulating film to said first semiconductor layer between said second semiconductor layer and said fifth semiconductor layer, said second electrode being connected to said first electrode; and a third electrode electrically connected to both of said third semiconductor layer and said fourth semiconductor layer.

* * * * *